(12) United States Patent
Kamble et al.

(10) Patent No.: US 11,561,856 B2
(45) Date of Patent: Jan. 24, 2023

(54) ERASURE CODING OF REPLICATED DATA BLOCKS

(71) Applicant: NUTANIX, INC., San Jose, CA (US)

(72) Inventors: Snehal Sharadchandra Kamble, Apex, NC (US); Karan Gupta, San Jose, CA (US); Ajaykrishna Raghavan, Santa Clara, CA (US); Peter Scott Wyckoff, Durham, NC (US)

(73) Assignee: NUTANIX, INC., San Jose, CA (US)

( * ) Notice: Subject to any disclaimer, the term of this patent is extended or adjusted under 35 U.S.C. 154(b) by 26 days.

(21) Appl. No.: 17/236,960

(22) Filed: Apr. 21, 2021

(65) Prior Publication Data

US 2022/0188189 A1 Jun. 16, 2022

Related U.S. Application Data

(60) Provisional application No. 63/123,970, filed on Dec. 10, 2020.

(51) Int. Cl.
*H03M 11/00* (2006.01)
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
CPC .................. G06F 11/1076; H03M 13/154
See application file for complete search history.

(56) References Cited

U.S. PATENT DOCUMENTS

| | | |
|---|---|---|
| 8,549,518 B1 | 10/2013 | Aron et al. |
| 8,601,473 B1 | 12/2013 | Aron et al. |
| 8,799,746 B2 | 8/2014 | Baker et al. |
| 8,850,130 B1 | 9/2014 | Aron et al. |
| 8,863,124 B1 | 10/2014 | Aron |
| 9,009,106 B1 | 4/2015 | Aron et al. |
| 9,069,708 B2 | 6/2015 | Gill et al. |
| 9,336,132 B1 | 5/2016 | Aron et al. |
| 9,652,265 B1 | 5/2017 | Narayanasamy et al. |
| 9,672,106 B2 | 6/2017 | Bronnikov et al. |
| 9,690,657 B2 * | 6/2017 | Iliadis ................. G06F 11/1076 |
| 9,747,287 B1 | 8/2017 | Bhardwaj et al. |
| 9,772,866 B1 | 9/2017 | Aron et al. |

(Continued)

OTHER PUBLICATIONS

M. K. Aguilera, R. Janakiraman and L. Xu, "Using erasure codes efficiently for storage in a distributed system," 2005 International Conference on Dependable Systems and Networks (DSN'05), 2005, pp. 336-345, doi: 10.1109/DSN.2005.96. (Year: 2005).*

(Continued)

*Primary Examiner* — Daniel F. McMahon
(74) *Attorney, Agent, or Firm* — Artegis Law Group, LLP

(57) ABSTRACT

Various embodiments set forth techniques for erasure coding of replicated data blocks. The techniques include receiving, by a pre-designated node, data associated with an erasure coded strip from a first node; receiving, by the pre-designated node, a replica for a first data block; saving the replica in an erasure coded strip; and in response to a trigger condition, replacing, by the pre-designated node, the replica and at least one replica of a second data block with an error correction block.

21 Claims, 12 Drawing Sheets

(56) References Cited

U.S. PATENT DOCUMENTS

| | | | |
|---|---|---|---|
| 9,916,198 B2* | 3/2018 | Baker | G06F 3/067 |
| 2007/0177739 A1 | 8/2007 | Ganguly et al. | |
| 2014/0229796 A1* | 8/2014 | Sakurai | G06F 11/1008 |
| | | | 714/764 |
| 2017/0185330 A1 | 6/2017 | Danilov et al. | |
| 2019/0042365 A1* | 2/2019 | Malone | H03M 13/154 |
| 2020/0117362 A1 | 4/2020 | McCarthy et al. | |
| 2020/0117372 A1* | 4/2020 | Corey | G06F 3/0653 |
| 2021/0096952 A1* | 4/2021 | Ali | G06F 3/0689 |

OTHER PUBLICATIONS

Poitras, Steven. "The Nutanix Bible" (Oct. 15, 2013), from http://stevenpoitras.com/the-nutanix-bible/ (Publication date based on indicated capture date by Archive.org; first publication date unknown); pp. all.

Poitras, Steven. "The Nutanix Bible" (Jan. 11, 2014), from http://stevenpoitras.com/the-nutanix-bible/ (Publication date based on indicated capture date by Archive.org; first publication date unknown); pp. all.

Poitras, Steven. "The Nutanix Bible" (Jun. 20, 2014), from http://stevenpoitras.com/the-nutanix-bible/ (Publication date based on indicated capture date by Archive.org; first publication date unknown); pp. all.

Poitras, Steven. "The Nutanix Bible" (Jan. 7, 2015), from http://stevenpoitras.com/the-nutanix-bible/ (Publication date based on indicated capture date by Archive.org; first publication date unknown); pp. all.

Poitras, Steven. "The Nutanix Bible" (Jun. 9, 2015), from http://stevenpoitras.com/the-nutanix-bible/ (Publication date based on indicated capture date by Archive.org; first publication date unknown); pp. all.

Poitras, Steven. "The Nutanix Bible" (Sep. 4, 2015), from https://nutanixbible.com/; pp. all.

Poitras, Steven. "The Nutanix Bible" (Jan. 12, 2016), from https://nutanixbible.com/; pp. all.

Poitras, Steven. "The Nutanix Bible" (Jun. 9, 2016), from https://nutanixbible.com/; pp. all.

Poitras, Steven. "The Nutanix Bible" (Jan. 3, 2017), from https://nutanixbible.com/; pp. all.

Poitras, Steven. "The Nutanix Bible" (Jun. 8, 2017), from https://nutanixbible.com/; pp. all.

Poitras, Steven. "The Nutanix Bible" (Jan. 3, 2018), from https://nutanixbible.com/; pp. all.

Poitras, Steven. "The Nutanix Bible" (Jun. 25, 2018), from https://nutanixbible.com/; pp. all.

Poitras, Steven. "The Nutanix Bible" (Jan. 8, 2019), from https://nutanixbible.com/; pp. all.

Poitras, Steven. "The Nutanix Bible" (Jul. 25, 2019), from https://nutanixbible.com/; pp. all.

Poitras, Steven. "The Nutanix Bible" (Sep. 17, 2019), from https://nutanixbible.com/; pp. all.

Cano, Ignacio et al. "Curator: Self-Managing Storage for Enterprise Clusters"; University of Washington; published Mar. 2017; pp. all.

Poitras, Steven. "The Nutanix Bible" (Mar. 2, 2020), from https://nutanixbible.com/; pp. all.

Poitras, Steven. "The Nutanix Bible" (Sep. 1, 2020), from https://nutanixbible.com/; pp. all.

Ahn, Hoo-Young et al. "Dynamic erasure coding decision for modern block-oriented distributed storage systems" J Supercomput (2016) 72:1312-1341, Published Feb. 17, 2016, https://sci-hub.do/10.1007/s11227-016-1661-7, 30 pages.

Cloudera, "Erasure coding overview" Published 2020, https://docs.cloudera.com/runtime/7.2.2/scaling-namespaces/topics/hdfs-ec-overview.html, 3 pages.

Li, Runhui, "Enabling Efficient and Reliable Transition from Replication to Erasure Coding for Clustered File Systems" First Published by IEEE/IFIP International Conference on Dependable Systems and Networks 2015, https://www.cse.cuhk.edu.hk/~pclee/www/pubs/tpds17ear.pdf, 14 pages.

* cited by examiner

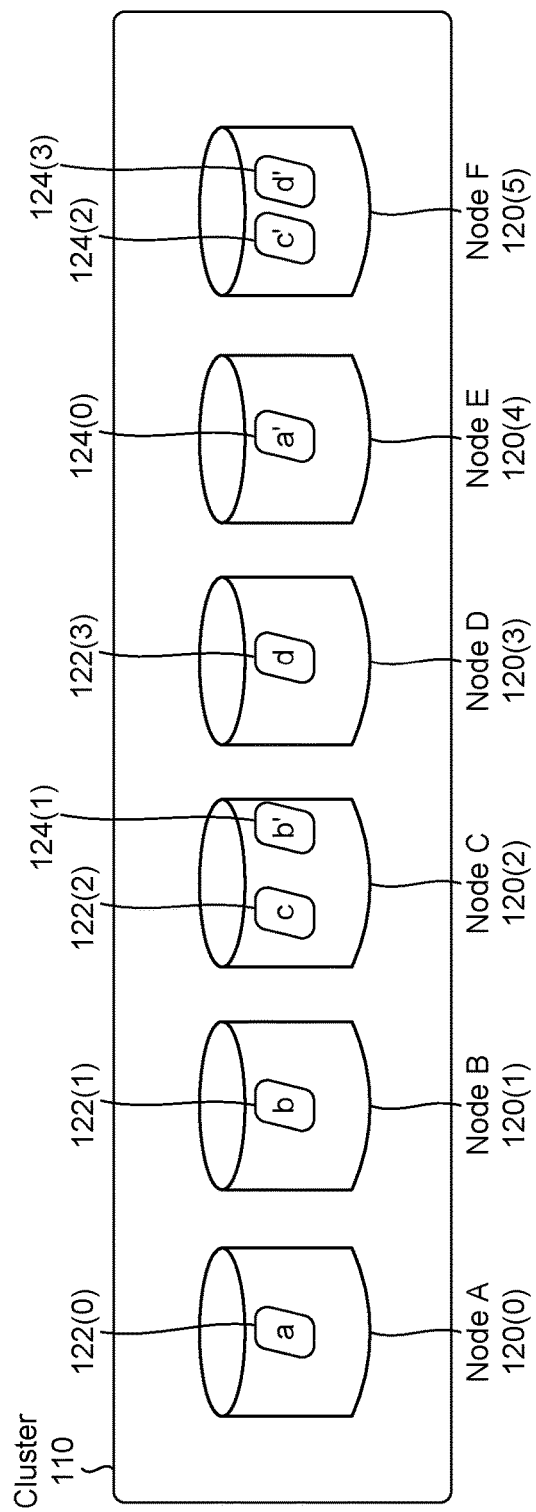
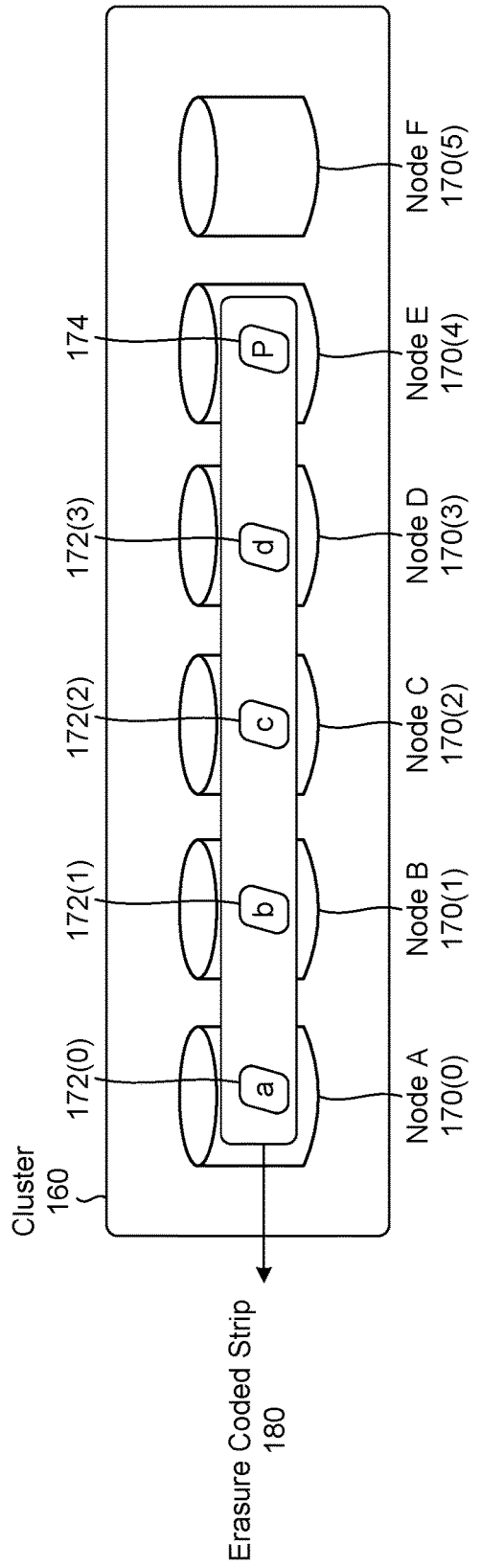

ERASURE CODING OF REPLICATED DATA BLOCKS

CROSS-REFERENCE TO RELATED APPLICATIONS

This application claims priority benefit of the U.S. Provisional Patent Application titled, "ERASURE CODING OF REPLICATED DATA BLOCK," filed on Dec. 10, 2020 and having Ser. No. 63/123,970. The subject matter of this related application is hereby incorporated herein by reference.

TECHNICAL FIELD

The contemplated embodiments relate generally to management of storage in a computing system and, more specifically, to erasure coding of replicated data blocks.

BACKGROUND

To provide redundancy and recovery of data after a failure, a storage system can use replication. In replication, a primary copy of a data block is stored on a first node in a computing system and at least one secondary copy is replicated and stored on a second node in the computing system. Thus, if the first node suffers a failure or becomes unavailable, the data block can be read from the secondary (e.g., replicated) copy from the second node. The number of replicated copies of each data block is controlled according to a replication factor (RF) that indicates how many copies of each data block are stored on different nodes. For example, when RF=2, two copies of a data block are stored on two different nodes, (e.g., the primary copy on a first node and a replica on a second node). When RF=3, three copies of a data block are stored on three different nodes (e.g., the primary copy on a first node, a first replica on a second node, and a second replica on a third node). With RF=3, if one or two nodes suffers a failure or becomes unavailable, the data block can be read from the third node that stores either the primary copy or a replica. Storing all of these copies on different nodes significantly increases the amount of storage used to store data blocks. With RF=2, the amount of storage doubles, and with RF=3, the amount of storage triples.

One technique for reducing the amount of storage used by replication is erasure coding. In erasure coding, a group of replicas (sometimes call an erasure coded strip) is replaced with an error correction block, such as a parity block, generated using the data in each of the replica blocks. After the error correction block is generated, the replicas are deleted (erased). When any of the nodes with a primary copy of a data block within the group fails or becomes unavailable, the error correction block and the other primary data blocks in the erasure coded strip can be used to regenerate the missing primary block. The number of error correction blocks is based on the RF configuration. Thus, for RF=2, a group of replicas is replaced by just one error correction block. Similarly, for RF=3, a group of replicas is replaced by just two error correction blocks. This technique greatly reduces the amount of storage because a group of replicas is replaced by error correction blocks that provide fault tolerance to the entire erasure coded strip.

To make erasure coding effective for reducing storage space, the erasure coding should happen as soon as possible. However, prior techniques for doing so involve complex scanning techniques and long delays before performing erasure coding. In general, erasure coding of an erasure coded strip is delayed until the data blocks have not been written for a threshold period of time, indicating that the blocks are not likely to be written in the near future. Such data blocks are referred to herein as write cold blocks. Replicas are stored on the nodes of a system for a significant amount of time before the replicas are deemed to be write cold blocks and replaced by an error correction block. As a result, the nodes inefficiently store replicas for prolonged periods of time until erasure coding is performed.

Accordingly, there is need for improved techniques for erasure coding of replicated data blocks.

SUMMARY

Various embodiments set forth a method for erasure coding of replicated data blocks. The method includes receiving, by a pre-designated node, a replica for a first data block; saving the replica in an erasure coded strip; and in response to a trigger condition, replacing, by the pre-designated node, the replica and at least one replica of a second data block with an error correction block.

Various embodiments set forth a method for erasure coding of replicated data blocks. The method includes receiving a write request for a first data block, having a primary copy of the first data block saved, sending a first replica of the first data block to a pre-designated node, receiving a second replica of a second data block, saving the second replica in an erasure coded strip, and in response to a trigger condition, replacing the second replica and at least one replica of a third data block with an error correction block.

Various embodiments of the present disclosure set forth or more non-transitory computer-readable media storing program instructions that, when executed by one or more processors, cause the one or more processors to perform steps for erasure coding of replicated data blocks. The steps include receiving, by a pre-designated node, data associated with an erasure coded strip from a first node; receiving, by the pre-designated node, a replica for a first data block; saving the replica in an erasure coded strip; and in response to a trigger condition, replacing, by the pre-designated node, the replica and at least one replica of a second data block with an error correction block.

Various embodiments of the present disclosure set forth or more non-transitory computer-readable media storing program instructions that, when executed by one or more processors, cause the one or more processors to perform steps for erasure coding replicated data blocks. The steps include receiving, at a first node, a write request for a first data block; having a primary copy of the first data block saved; designating a pre-designated node to generate an erasure coded strip that includes the first data block; transmitting data associated with the erasure coded strip to the pre-designated node; and sending a replica of the first data block to the pre-designated node for storage in the erasure coded strip on the pre-designated node.

Other embodiments include, without limitation, methods and systems that implement one or more aspects of the disclosed techniques.

At least one technical advantage of the disclosed techniques relative to the prior art is that the disclosed techniques can, for write-once-read-many data blocks, remove replicas from the nodes of a cluster and replace the replicas with an error correction block more quickly than previous approaches. This reduces the amount of storage used by the cluster to support replication. Additionally, the disclosed techniques reduce network traffic during erasure coding because erasure coding of an erasure coded strip is performed on a single node of the cluster. The disclosed techniques also avoid the need for a background scanning process to monitor the write-once-read-many data blocks for their write cold status. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 1A is a block diagram illustrating data placement in a cluster before erasure coding.

FIG. 1B is a block diagram illustrating data placement in the cluster of FIG. 1A after erasure coding.

For clarity, identical reference numbers have been used, where applicable, to designate identical elements that are common between figures. It is contemplated that features of one embodiment may be incorporated in other embodiments without further recitation.

DETAILED DESCRIPTION

Figure 2:
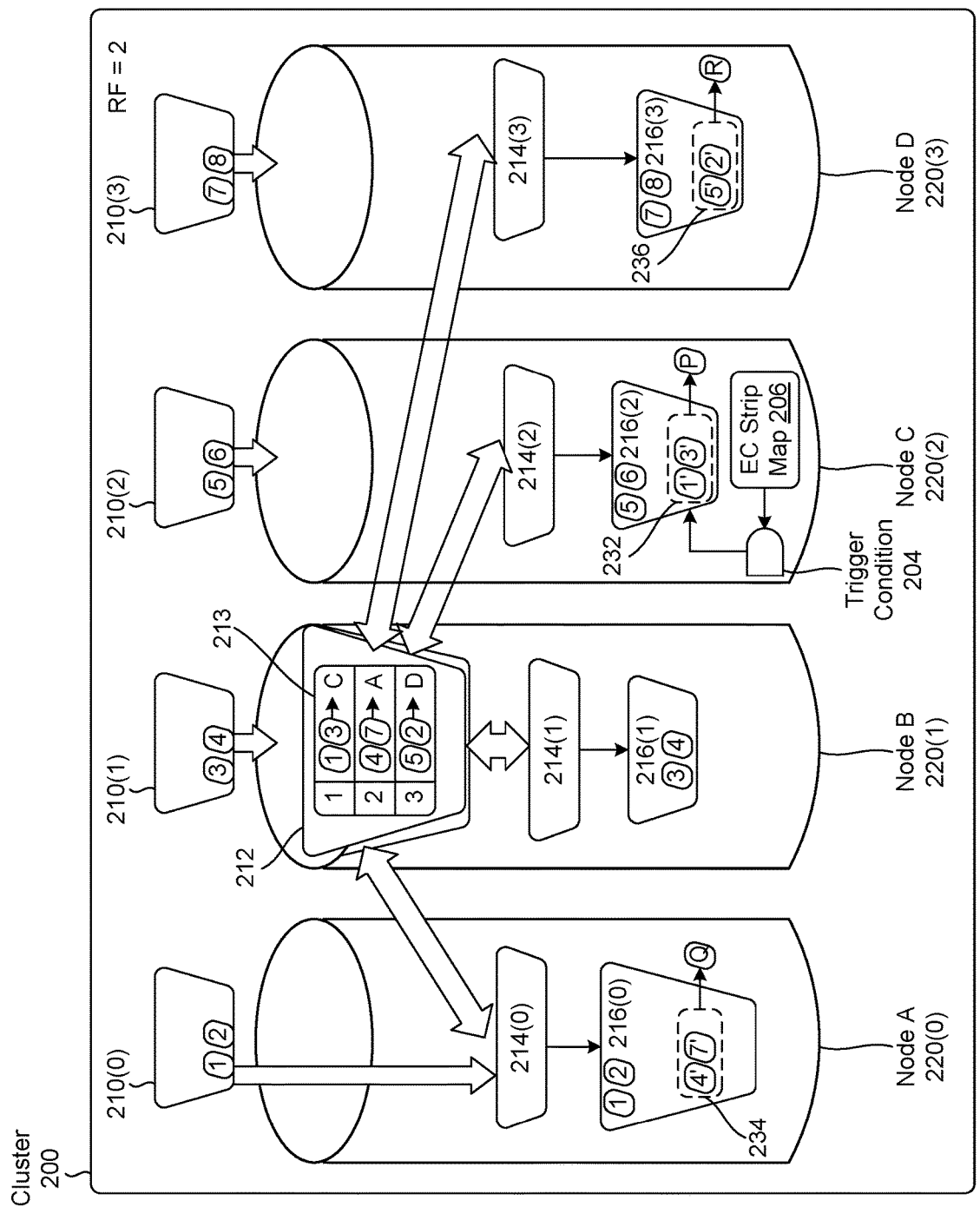
FIG. 2 is a block diagram illustrating an architecture for performing erasure coding while preserving data locality according to various embodiments of the present disclosure.

In the following description, numerous specific details are set forth to provide a more thorough understanding of the various embodiments. However, it will be apparent to one of skilled in the art that the inventive concepts may be practiced without one or more of these specific details.

Erasure Coding

FIG. 1A is a block diagram illustrating data placement in a cluster before erasure coding. As shown in FIG. 1A, a cluster 110 includes six nodes: node A 120(0), node B 120(1), node C 120(2), node D 120(3), node E 120(4), and node F 120(5). Four data blocks 122(0)-122(3) have been written to the cluster 110 with RF=2. The primary copy of data block a 122(0) has been written on node A 120(0) and the replica a' 124(0) has been written to node E 120(4). The primary copy of data block b 122(1) has been written on node B 120(1) and the replica b' 124(1) has been written to node C 120(2). The primary copy of data block c 122(2) has been written on node C 120(2) and the replica c' 124(2) has been written to node F 120(5). The primary copy of data block d 122(3) has been written on node D 120(3) and the replica d' 124(3) has been written to node F 120(5).

A background scanning process periodically scans nodes A-F 120(0)-120(5) in the cluster 110 looking for suitable candidates for erasure coding. In some examples, this background scanning process may be distributed across the nodes 120(0)-120(5) using map-reduce techniques. Once a group of data blocks 122(0)-122(3)/replicas 124(0)-124(3) is identified for erasure coding, an error correction block is generated the from data in the candidate data blocks. For example, the error correction block may be generated by determining an exclusive OR of the data in the candidate data blocks. The error correction block is then stored in one of the nodes not containing the primary data blocks for the group and the replicas for the group are deleted. The space previously used by the replicas is now available for storing other data blocks or replicas. Erasure coding and the scanning process are described in further detail in U.S. Pat. No. 9,672,106, which is incorporated by reference herein.

FIG. 1B is a block diagram illustrating data placement in the cluster of FIG. 1A after erasure coding. As shown in FIG. 1B, the group of candidate blocks selected for erasure coding are data block a 172(0), data block b 172(1), data block c 172(2), and data block d 172(3). An error correction (e.g., parity) block P 174 has been generated and stored on node E 170(4). The replicas a' 124(0), b' 124(1), c' 124(2), and d' 124(3) on nodes E 120(4), C 120(2), F 120(5), and F 120(5), respectively have been deleted. An erasure coded strip containing data blocks a 172(0), b 172(1), c 172(2), and d 172(3) along with error correction block P 174 has also been generated. In the event of failure or unavailability in any one of nodes A-E 170(0)-170(4), the no longer available data block a-d 172(0)-172(3) or the error correction block P 174 may be recovered using the still available ones of the data blocks a-d 172(0)-172(3) and the error correction block P 174.

One issue with the approach illustrated in FIGS. 1A and 1B is that if there is a write to any of data blocks a-d 172(0)-172(3) after the error correction block P 174 is generated, the error correction block P 174 has to be updated in order for the erasure coded strip to support rebuilding of an unavailable block. To avoid this type of expensive read-modify-write operation, the background scanning process looks for write cold blocks that have not been written to for a threshold period of time. For example, the threshold period of time may be as long as seven days for typical data blocks and one day for data blocks in snapshots. Thus, replicas may take up storage space for an extended period of time before they are erasure coded.

This approach, however, is overly conservative for certain types of workloads. For example, many workloads work with write-once-read-many data blocks that do not change once they are initially written to the cluster. With write-once-read-many data blocks it is not necessary to wait for the data blocks to become write cold before they are placed in an erasure coded strip as these data blocks are not going to be written to again.

Erasure Coding for Write-Once-Read-Many Data Blocks

FIG. 2 is a block diagram illustrating an architecture for performing erasure coding while preserving data locality according to various embodiments of the present disclosure. As shown in FIG. 2, the architecture includes a cluster 200 with four nodes A-D 220(0)-220(3). A centralized strip generator leader 212 is a module located on node B 220(1) and each of the nodes A-D 220(0)-220(3) includes its own strip generator worker 214(0)-214(3) that responds to write requests 210(0)-210(3) directed to the respective node and manages data on an extent store 216(0)-216(3) or other data repository. As further shown in FIG. 2, node A 220(0) has received write requests 210(0) for data blocks 1 and 2, which have been stored to the extent store 216(0) on node A 220(0), thus preserving data locality because the initial copy of each data block 1 and 2 is stored on node A 220(0) where the write request 210(0) was received. Similarly, node B 220(1) has received write requests 210(1) for data blocks 3 and 4 and the initial copies of data blocks 3 and 4 are stored in the extent store 216(1) on node B 220(1). Node C 220(2) similarly handles the write requests 210(2) for, and stores the initial copies of, data blocks 5 and 6 and node D 220(3) similarly handles the write requests 210(3) for, and stores the initial copies of, data blocks 7 and 8.

Overall management of erasure coding is handled by the strip generator leader 212 on node B 220(1). The strip generator leader 212 pre-generates erasure coded strips based on the configuration for the cluster 200, and generates a strip map 213 that identifies the data blocks in each erasure coded strip. Rather than allowing the strip generator workers 214(0)-214(3) to send the replicas of the data blocks to just any of the nodes 220(0)-220(3) in the cluster 200, the strip generator leader 212 pre-generates erasure coded strips that pre-designate where a strip generator worker 214 is to send the replicas. Under this approach the erasure coded strips are set-up in advance by the strip generator worker 214 on the pre-designated node where the replicas are being collected. In some embodiments, the strip generator leader 212 may periodically generate new erasure coded strips on the various pre-designated nodes and/or may generate the erasure coded strips upon the request of a strip generator worker 214 that has received a write request 210 for a data block and the strip generator worker 214 has not yet been assigned a pre-designated node to send the replica of the data block to. The strip generator leader 212 then commands the first strip generator worker 214 that when the first strip generator worker 214 receives a write request 210, the first strip generator worker 214 is to send the replica to the pre-designated node. The strip generator leader 212 also commands the strip generator worker 214 on the pre-designated node to generate an erasure coded strip for the replicas that the pre-designated node receives from the first strip generator worker 214.

This generation of erasure coded strips and pre-designated nodes for replicas is illustrated in FIG. 2. As shown in FIG. 2, the strip generator leader 212 has set-up three erasure coded strips. Erasure coded strip 1 232 indicates that replicas for write request 210(0) on node A 220(0) and node B 220(1) are to be sent to pre-designated node C 220(2), and the strip generator workers 214(0)-214(3) on nodes A and B 220(0)-220(1) are informed of this assignment by the strip generator leader 212. The strip generator worker 214(2) on node C 220(2) is also commanded by the strip generator leader 212 to set-up erasure coded strip 1 232. As further shown in FIG. 2, the strip generator worker 214(2) on node C 220(2) has received replica 1' from node A 220(0) and replica 3' from node B 220(1) and placed them in erasure coded strip 1 232.

The strip generator worker 214(2) on node C 220(2) keeps track of the generation of erasure coded strip 1 232 and the receiving of replicas 1' and 3' using an erasure coded strip map 206. In response to a trigger condition 204, the strip generator worker 214(2) on node C 220(2) generates an error correction block P for replicas 1' and 3', saves error correction block P, and then deletes replicas 1' and 3'.

In some embodiments, the trigger condition 204 may correspond to a pre-set time delay, a data capacity trigger for the replicas in erasure coded strip 1 232, and/or the like. In a first example, the pre-set time delay may be on the order of 1 minute to 5 minutes after which erasure coded strip 1 232 is generated, whether or not all data blocks for all replicas have been received. In a second example, the trigger condition 204 may correspond to a threshold minimum number of replicas included in erasure coded strip 1 232. Because, in general, the minimum number of data block replicas needed to form an erasure coded strip is two replicas, the minimum number of replicas included in erasure coded stripe 1 233 may correspond to all of the replicas, at least two replicas, at least three replicas, at least 75% of the replicas, and/or the like. In a third example, the trigger condition 204 may correspond to a threshold minimum amount of data (e.g., 4 megabytes) received for erasure coded strip 1 232.

Similarly, the strip generator leader 212 has set-up an erasure coded strip 2 234 on node A 220(0) for erasure coding replicas received from nodes B and D 220(1) and 220(3) and an erasure coded strip 3 236 on node D 220(3) for replicas from nodes A and C 220(0)-220(2). In response to respective trigger conditions, the strip generator worker 214(0) on node A 220(0) has replaced replicas 4' and 7' in erasure coded strip 2 234 with error correction block Q, the strip generator worker 214(3) on node D 220(3) has replaced replicas in 5' and 2' in erasure coded strip with error correction block R. An additional erasure coded strip (not shown) for data blocks 6 and 8 may also be set-up by the strip generator leader 212 and the strip generator worker 214 for the pre-designated node for the additional erasure coded strip.

The strip generator leader 212 further keeps track of which data blocks and error correction blocks are associated with each erasure coded strip to support regeneration of a data block that is no longer available due to node and/or extent store failure and/or unavailability.

According to some embodiments, because the placement of the primary and secondary copies/replicas of each new data block is already designated by strip generator leader 212 and the erasure coded strips are set-up in advance, each individual strip generator worker is able to proceed with erasure coding of the erasure coded strips based on local information. In addition, the replicas for a particular erasure coded strip are stored on a single node, thereby avoiding cross-node transfers during generation of the error correction block for the erasure coded strip. This approach avoids requiring a cluster-wide scan of replicas to identify suitable candidate replicas for erasure coding. Further, the generation of error correction blocks and subsequent deletion of erasure coded replicas is also handled locally by the strip generator worker 214(0)-214(3) at each node 220(0)-220(3). This approach further minimizes network traffic during the erasure coding process. According to some embodiments, the nodes 220(0)-220(3) may preserve data locality at the file level. In such embodiments, the data blocks for a particular file are stored on a single node 220. This approach minimizes network traffic during when accessing different portions of large files.

Figure 3:
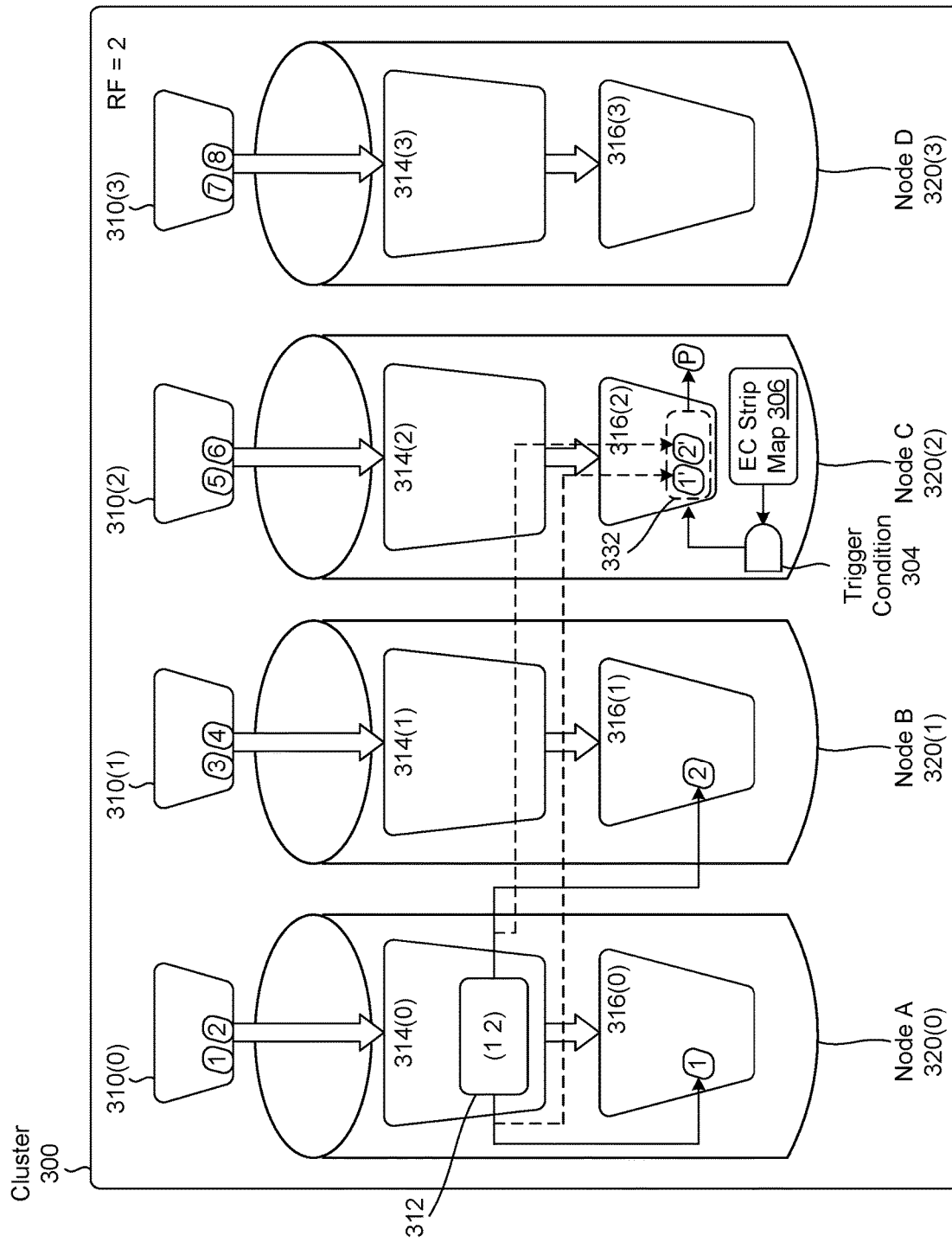
FIG. 3 is a block diagram illustrating an architecture for performing erasure coding without preserving data locality according to various embodiments of the present disclosure.

Not all applications or workloads need to preserve data locality. Without having to preserve data locality, each individual node in a cluster is able to autonomously control where that node stores the primary copy of a data block. In addition, absence of a need to preserve data locality allows a node strip generator in each node to decide which node is the pre-designated node for storing replicas and managing erasure coded strips. FIG. 3 is a block diagram illustrating an architecture for performing erasure coding without preserving data locality according to various embodiments of the present disclosure. As shown in FIG. 3, the architecture includes a cluster 300 with four nodes A-D 320(0)-320(3). Each of the nodes A-D 320(0)-320(3) includes its own node strip generator 314(0)-314(3) that responds to write requests 310(0)-310(3) directed to the respective node 320 and manages data on an extent store 316(0)-316(3) or other data repository.

Focusing on node A 320(0), the node strip generator 314(0) on node A 320(0) has pre-designated node C 320(2) to receive replicas from node A 320(0) and node C 320(2) has generated an erasure coded strip for the replicas from node A 320(0). As further shown in FIG. 3, the node strip generator 314(0) on node A 320(0) upon receiving a write request 310(0) for data block 1 has written the primary copy of data block 1 in the extent store 316(0) on node A 320(0). The node strip generator 314(0) on node A 320(0) has also sent the replica 1' to node C 320(2) where the node strip generator 314(2) on node C 320(2) has placed in replica 1' in the erasure coded strip, stored in the extent store 316(2), that node C 320(2) is maintaining on behalf of node A 320(0). The node strip generator 314(0) on node A 320(0) upon receiving a write request 310(0) for data block 2 has sent the initial copy of data block 2 to the extent store 316(1) on node B 320(1) and the replica 2' to the extent store 316(2) on node C 320(2). Upon receiving replica 2', the node strip generator 314(2) on node C 320(2) places replica 2' in the erasure coded strip node C 320(2) is maintaining on behalf of node A 320(0). After receiving replicas 1' and 2' and in response to a trigger condition 304, the node strip generator 314(2) on node C 320(2) generates and saves an error correction block P for the erasure coded strip containing replicas 1' and 2' and then deletes replicas 1' and 2. The node strip generator 314(2) on node C 320(2) further uses an erasure coded (EC) strip map 306 to keep track of which of replicas 1' and 2' are in the erasure coded strip and that error correction block P is associated with data blocks 1 and 2 after error correction block P is generated.

In some embodiments, the trigger condition 304 may correspond to a pre-set time delay, a data capacity trigger for the replicas in erasure coded strip 1 332, and/or the like. In a first example, the pre-set time delay may be on the order of 1 minute to 5 minutes after which erasure coded strip 1 332 is generated, whether or not all data blocks for all replicas have been received. In a second example, the trigger condition 304 may correspond to a threshold minimum number of replicas included in erasure coded strip 1 332 (e.g., all of the replicas, at least three replicas, at least 75% of the replicas, and/or the like). In a third example, the trigger condition 304 may correspond to a threshold minimum amount of data (e.g., 4 megabytes) received for erasure coded strip 1 332 meet or exceed.

In similar fashion, the node strip generator 314(1) on node B 320(1) handles write requests 310(1) for data blocks 3 and 4, the node strip generator 314(2) on node C 320(2) handles write requests 310(2) for data blocks 5 and 6, and the node strip generator 314(3) on node D 320(3) handles write requests 310(3) for data blocks 7 and 8.

According to some embodiments, because each node strip generator sends all of its replicas to a pre-designated node where an erasure coded strip is already set-up, each individual node strip generator is able to proceed with erasure coding of the erasure coded strips based on local information. This avoids requiring a cluster-wide scan of replicas to identify suitable candidate replicas for erasure coding. Further, the generation of error correction blocks and subsequent deletion of erasure coded replicas is also handled locally by the node strip generator at each node. This further minimizes network traffic during the erasure coding process.

In some embodiments consistent with both FIGS. 2 and 3, the erasure coded strip on the designated node may be initially generated in a fast storage tier (e.g., a sold-state drive (SSD), an NVMe device, and/or the like) on the pre-designated node. This allows the pre-designated node to rapidly store the replicas and access the replicas while generating the error correction block. Once the error correction block is generated, the error correction block may be stored in a slower storage tier and the space on the fast storage tier may be freed for other uses.

Figure 4:
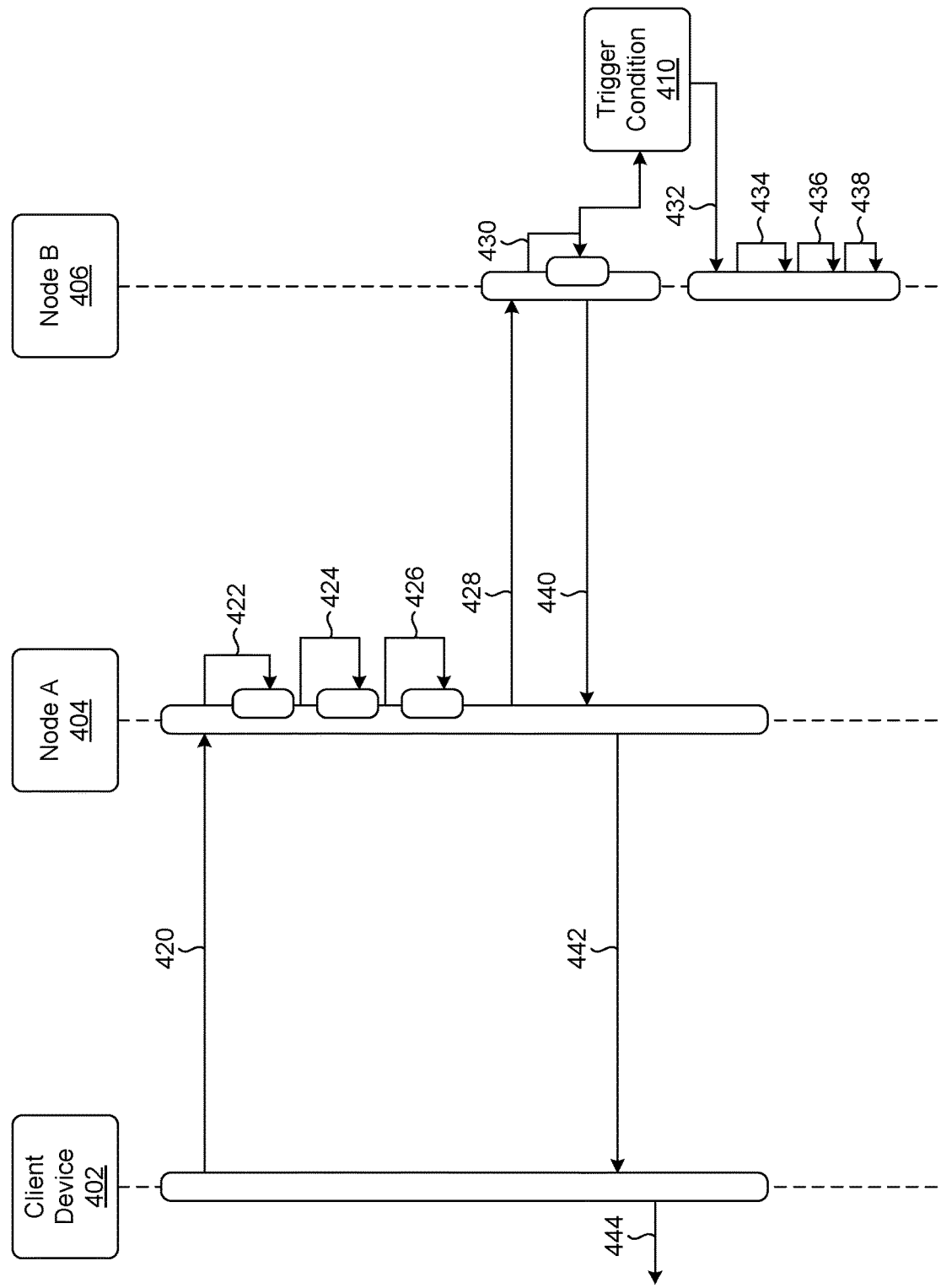
FIG. 4 is an interaction diagram illustrating erasure coding according to various embodiments of the present disclosure.

FIG. 4 is an interaction diagram illustrating erasure coding according to various embodiments of the present disclosure. As shown, the interaction diagram illustrating interactions between a client device 402, a first node A 404, and a second node B 406. In some embodiments, the method steps of FIG. 4 are consistent with the steps performed by strip generator leader 212 and the various strip generator workers 214(0)-214(3) of FIG. 2 and the steps performed by the node strip generators 314(0)-314(3) of FIG. 3. In some embodiments, one or more of the method steps may be implemented, at least in part, in the form of executable code stored on one or more non-transitory, tangible, machine readable media that when run by one or more processors (e.g., one or more processors on the nodes of a cluster) may cause the one or more processors to perform one or more of the method steps.

As shown in FIG. 4, at step 420, the client device 402 issues a write request for a data block that is received at one of the nodes in the cluster and forwards the write request to a strip generator on node A 404. In some examples, the write request for the data block may be received by a strip generator worker or a node strip generator. At step 422, the pre-designated node (e.g., node B 406) generates a pre-generated erasure coded strip. At step 424, the strip generator worker or the node strip generator on node A 404 determines on which node (e.g., node A 404) the primary copy of the data block is to be stored and on which pre-designated node (e.g., node B 406) the pre-generated erasure coded strip for the data block is generated. In the examples of FIG. 2, the strip generator worker 214 is notified of the nodes for the primary and replica copies of the data block by the strip generator leader 212, and the strip generator leader 212 has the strip generator worker 214 on the pre-designated node B set-up the erasure coded strip. In the examples of FIG. 3, the node strip generator 314 determines the nodes for the primary and replica copies on its own, and the node strip generator receiving the write request has the node strip generator on the pre-designated node B set-up the erasure coded strip.

At step 426, the primary copy of the data block is stored in node A 404 by the strip generator worker on node A 404 or by the node strip generator on node A 404. In some examples consistent with FIG. 3, the node strip generator on the node that received the write request may forward the write request for the primary copy of the data block to node A 404. At step 428, a write request for the replica of the data block is also sent to the pre-designated node B 406. At step 430, the strip generator worker or the node strip generator saves the replica of the data block in the pre-generated erasure coded strip and updates the erasure coded strip map for the erasure coded strip.

In response, at step 440, the pre-designated node B 406 transmits an acknowledgement that the secondary copy of the replica of the data block has completed. At step 442, node A 404, in turn, transmits an acknowledgement that the primary copy of the data block has completed. At step 444, an acknowledgement that the primary and replica copies have completed is transmitted to the client device 402 that issued the write request.

At step 432, in response to a trigger condition 410, the pre-designated node B 406 initiates a process to encode the error correction block for the pre-generated erasure coded strip. In some embodiments, the trigger condition may correspond to a pre-set time delay, a data capacity trigger for the replicas in the pre-generated erasure coded strip, and/or the like. At step 434, the strip generator worker or the node strip generator on the pre-designated node B 406 reads the replicas designated by the erasure coded strip map. At step 436, the strip generator worker or the node strip generator on the pre-designated node B 406 generates the error correction block for the erasure coded strip and saves the error correction block in the extent store on the pre-designated node B 406. At step 438, the strip generator worker or the node strip generator on the pre-designated node B 406 deletes the replicas in the erasure coded strip, and updates the erasure coded strip map. Alternatively, the replacement of the replicas with the error correction block may be triggered by other events, such as the erasure coded strip reaching a predetermined capacity threshold.

As discussed above and further emphasized here, FIGS. 2-4 are merely examples which should not unduly limit the scope of the claims. One of ordinary skill in the art would recognize many variations, alternatives, and modifications. In some embodiments, the disclosed techniques may be used for replication factors other than RF=2. For example, when RF=3, erasure coded strips are pre-generated on two different pre-designated nodes and a replica is sent to each of the pre-designed nodes. Each of the pre-designated nodes then manage their respective erasure coded strips. When RF=N, there are N−1 pre-designated nodes with erasure coded strips.

Figure 5:
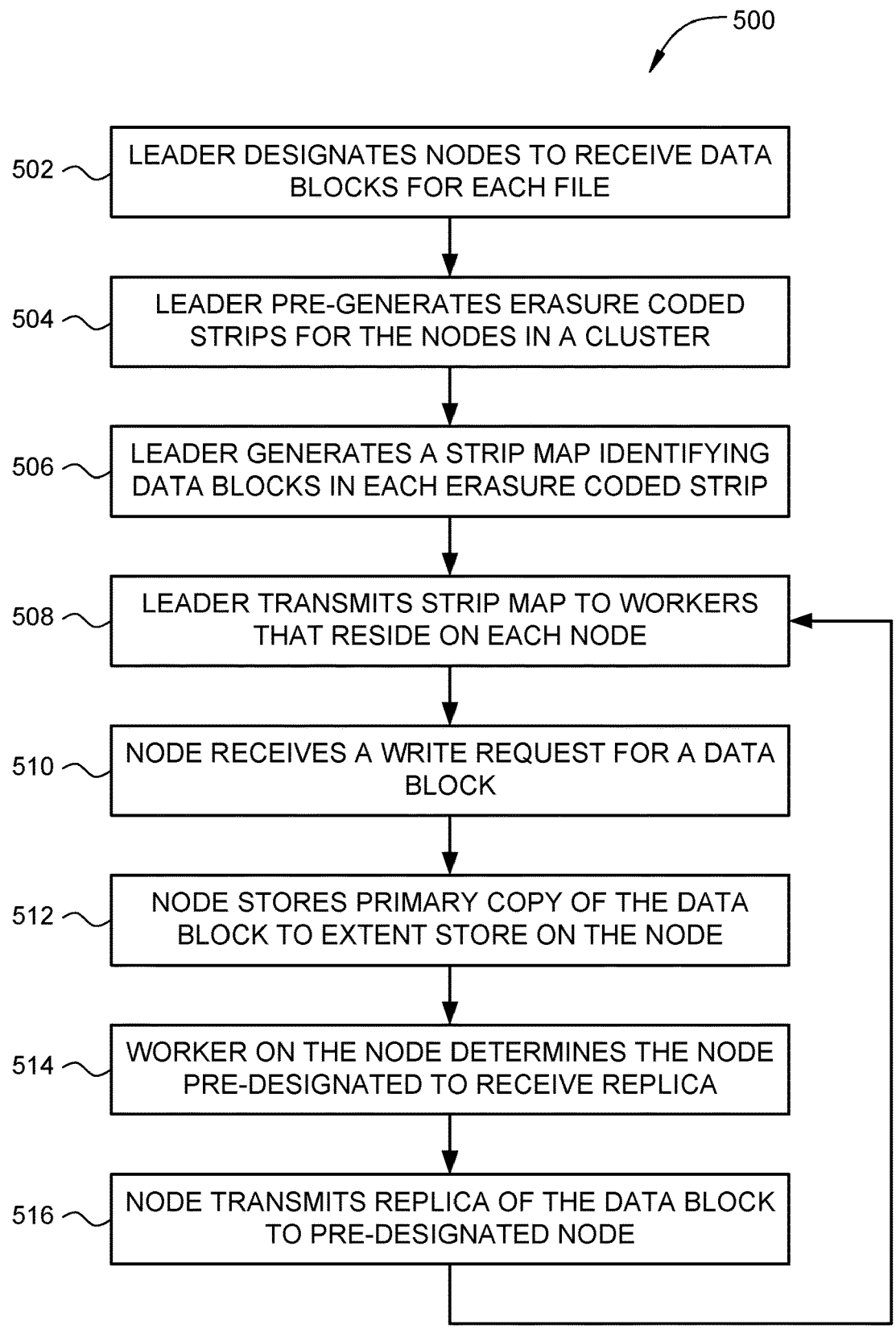
FIG. 5 is a flow diagram of method steps for performing erasure coding while preserving data locality according to various embodiments of the present disclosure.

FIG. 5 is a flow diagram of method steps for performing erasure coding while preserving data locality according to various embodiments of the present disclosure. Although the method steps are described in conjunction with the systems of FIGS. 1-4 and 8A-9, persons skilled in the art will understand that any system configured to perform the method steps, in any order, is within the scope of the present disclosure.

As shown, a method 500 begins at step 502, where a strip generator leader 212 located on a node 220 included in a cluster 200 designates nodes 220 that receive data blocks for each file stored in the cluster 200. Each node 220 in the cluster 220 receives a portion of the write requests for data blocks stored in the cluster 200. In order to preserve data locality, the strip generator leader 212 designates each node 220 to store the primary copy of the data blocks corresponding to write requests 210 received by the respective node 220. When a node 220 receives a data block, the node 220 stores the primary copy of the data block on an extent store 216 or other memory local to the same node 220. This approach minimizes network traffic when receiving data blocks and storing the primary copy of the data blocks.

Further, according to some embodiments, the nodes 220 may preserve data locality at the file level. In such embodiments, the data blocks for a particular file are stored on a single node 220. This approach minimizes network traffic during when accessing different portions of large files.

At step 504, the strip generator leader 212 pre-generates erasure coded strips for the nodes 220 in the cluster 200. The erasure coded strips are based on the configuration for the cluster 200. The erasure coded strips pre-designate where each strip generator worker 214 is to send the replicas of data blocks received at each node 220. Each erasure coded strip is pre-designated in a manner that all replicas for a particular erasure coded strip are stored on a single node 220. This approach minimizes network traffic when generating the error correction block for the erasure coded strip.

At step 506, the strip generator leader 212 generates a strip map 213 that identifies the data blocks in each erasure coded strip. The strip map further identifies, for each erasure coded strip included in the strip map 213, the node 220 that collects the replicas for the erasure coded strip and, in response to a trigger condition, generates the erasure coded strip. The strip map 213 is essentially a data structure that stores all of the relevant data for the erasure coded strips pre-generated in step 504.

At step 508, the strip generator leader 212 transmits the strip map 213 to the strip generator workers 214 that reside on each node 220, including the node 220 that hosts the strip generator leader 212. In some embodiments, the strip generator leader 212 may transmit the entire strip map 213 to each strip generator worker 214 on each of the nodes 220 in the cluster 200. In some embodiments, the strip generator leader 212 may transmit to each node 220 only those erasure encoded strips in the strip map 213 that correspond to the particular node 220. With this approach, the erasure coded strips are set-up in advance by the strip generator worker 214 on the pre-designated node 220 where the replicas are being collected.

At step 510, a node 220 within the cluster 200 receives a write request for a data block. The write request may be received from any computing device that stores data in the clusters, such as a server device, a client device, and/or the like. The computing device sends write requests to nodes 220 as designated by the strip generator leader 212 in step 502, thereby preserving data locality for the primary copies of the data blocks.

At step 512, the node 220 stores the primary copy of the data block in an extent store 216 or other memory located on the node 220. Given that the strip generator leader 212 has designated the nodes 220 that receive the write requests 210 for the data blocks in each file, each node 220 stores the primary data blocks in a local memory. As a result, the node 220 does not consume network bandwidth to transfer the primary copy of the data block to another node 220 for storage.

At step 514, the strip generator worker 214 on the node 220 determines which node 220 is designated by the erasure coded strip to receive the replica of the data block. In so doing, the node 220 retrieves data stored in the erasure coded strip map 206 stored in the node 220 to determine which erasure encoded strip includes the received data block. The node 220 retrieves data stored in the erasure coded strip map 206 stored in the node 220 to determine which node 220 is responsible for generating the erasure encoded block for the erasure coded strip. At step 516, the node 220 transmits a replica of the data block to the node 220 designated by the erasure coded strip. The method 500 then proceeds to step 510, described above, to receive write requests for additional data blocks. Alternatively, the method 500 proceeds to step 504, described above, where the strip generator leader 212 pre-generates additional erasure coded strips for the nodes in the cluster.

Figure 6:
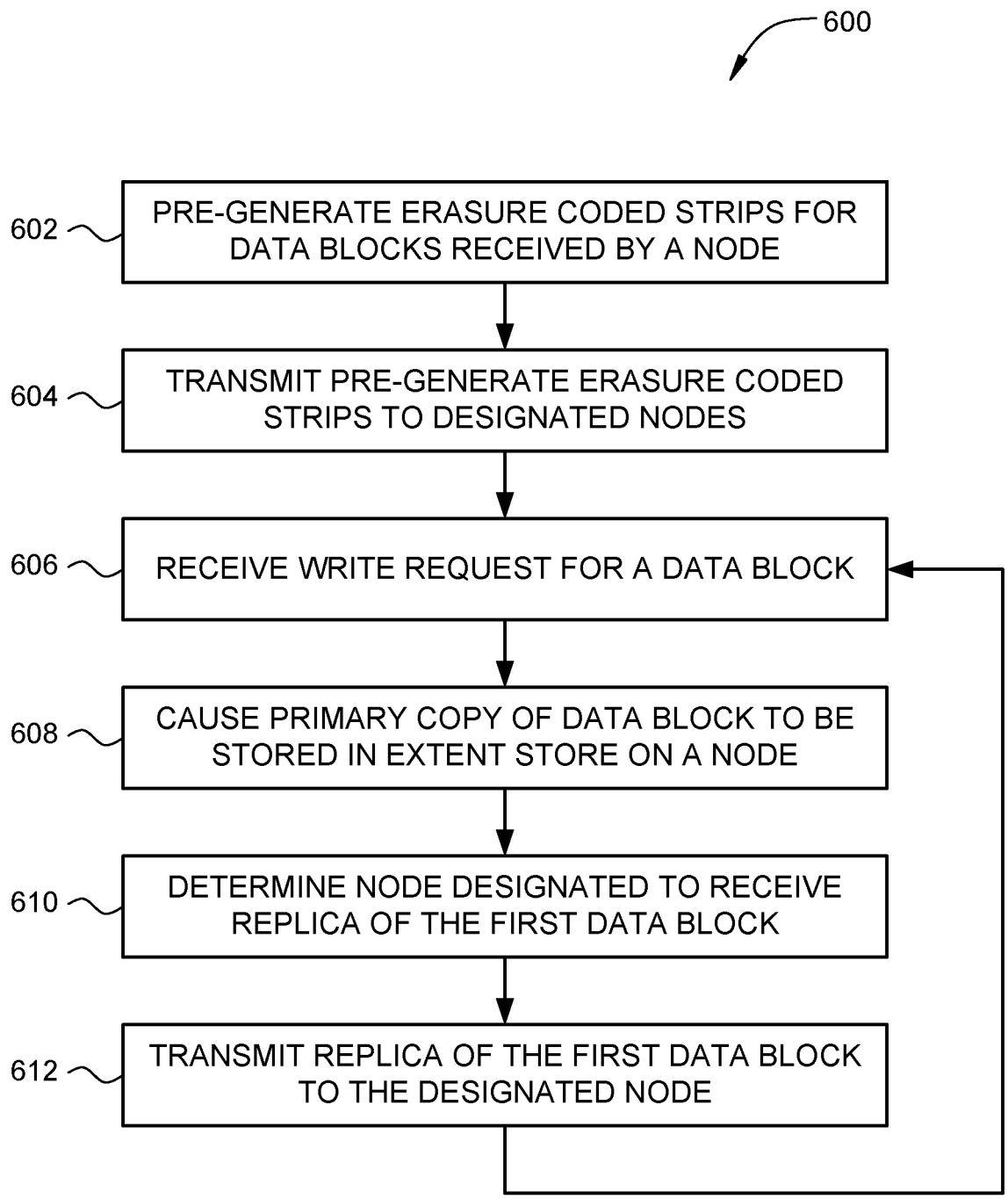
FIG. 6 is a flow diagram of method steps for performing erasure coding without preserving data locality according to various embodiments of the present disclosure.

FIG. 6 is a flow diagram of method steps for performing erasure coding without preserving data locality according to various embodiments of the present disclosure. Although the method steps are described in conjunction with the systems of FIGS. 1-4 and 8A-9, persons skilled in the art will understand that any system configured to perform the method steps, in any order, is within the scope of the present disclosure.

As shown, a method 600 begins at step 602, where a node strip generator 314 located on a node 320 included in a cluster 300 pre-generates erasure coded strips for data blocks received by the node 320. The erasure coded strips pre-designate where the node strip generator 314 is to send the replicas of data blocks received at the node 320.

At step 604, the node strip generator 314 transmits the pre-generated erasure coded strip information to each of the other node strip generators 314 designated to generate erasure coded strips for the node. Each erasure coded strip is pre-designated in a manner that all replicas for a particular erasure coded strip are stored on a single node 320. This approach minimizes network traffic when generating the error correction block for the erasure coded strip. In addition, each replica in an erasure coded strip is received from a single node 320.

At step 606, the node 320 receives a write request for a data block. The write request may be received from any computing device that stores data in the clusters, such as a server device, a client device, and/or the like. The write request may be received by the node 320 that stores the primary copy of the data block. Alternatively, the write request may be received by a node 320 that is different from the node 320 that stores the primary copy of the data block.

At step 608, the node 320, in response to receiving the write request 310, causes the primary copy of the data block to be stored in an extent store 316. In some embodiments, the node strip generator 314 located on the node 320 stores the primary copy of the data block in the extent store 316 located on the same node 320. Alternatively, in some embodiments, the node strip generator 314 located on the node 320 transmits the primary copy of the data block to another node 320 in the cluster 300. The other node 320 stores the primary copy of the data block in the extent store 316 located on the other node 320.

At step 610, the node strip generator 314 on the node 320 determines which node 320 is designated to receive the replica of the data block. In so doing, the node 320 retrieves data stored in the erasure coded strip map 306 stored in the node 320 to determine which erasure encoded strip is to include the received data block. The node 320 retrieves data stored in the erasure coded strip map 306 stored in the node 320 to determine which node 320 is responsible for generating the erasure encoded block for the erasure coded strip.

At step 612, the node 320 transmits a replica of the data block to the node 320 designated by the erasure coded strip. The method 600 then proceeds to step 606, described above, to receive write requests for additional data blocks. Alternatively, the method 600 proceeds to step 602, described above, where the node strip generator 314 pre-generates additional erasure coded strips for the node 320.

Figure 7:
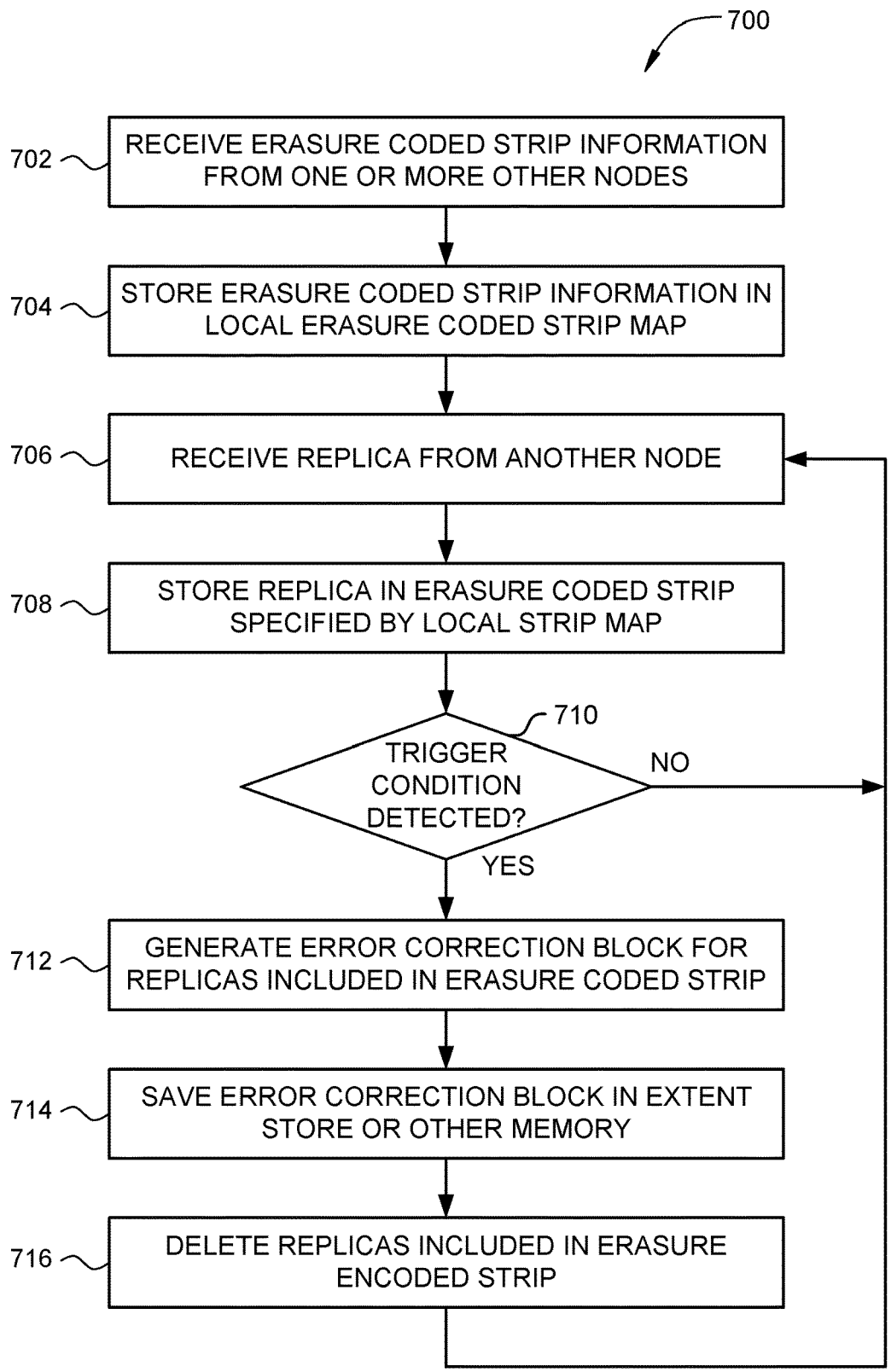
FIG. 7 is a flow diagram of method steps for generating an erasure coded strip according to various embodiments of the present disclosure.

FIG. 7 is a flow diagram of method steps for generating an erasure coded strip according to various embodiments of the present disclosure. Although the method steps are described in conjunction with the systems of FIGS. 1-4 and 8A-9, persons skilled in the art will understand that any system configured to perform the method steps, in any order, is within the scope of the present disclosure.

As shown, a method 700 begins at step 702, where a strip generator worker 214 or a node strip generator 314 located on a node included in a cluster receives erasure coded strip data from one or more other nodes. In some embodiments, the erasure coded strip data may be a strip map 206, or a portion thereof, that is generated by the strip generator leader 212. In some embodiments, the erasure coded strip data may be erasure coded strip map 306 generated by node strip generators 314 located on each node included in the cluster. The erasure coded strips pre-designate where each strip generator worker 214 or node strip generators 314 is to be sent the replicas of data blocks received at each node. Each erasure coded strip is pre-designated in a manner that all replicas for a particular erasure coded strip are stored on a single node. This approach minimizes network traffic when generating the error correction block for the erasure coded strip.

At step 704, the strip generator worker 214 or node strip generator 314 stores the received erasure coded strip data in a local erasure coded strip map 206 or 306. The strip generator worker 214 or node strip generator 314 stores the received erasure coded strip data in any available local memory in the node. At step 706, the strip generator worker 214 or node strip generator 314 receives a replica of a data block from another node. In general, the strip generator worker 214 or node strip generator 314 receives the replica of the data block from the node that received the write request for the data block. At step 708, the strip generator worker 214 or node strip generator 314 stores the replica of the data block. In so doing, the node retrieves data stored in the erasure coded strip map 206 or 306 stored in the node to determine which erasure encoded strip includes the received replica. The node stores the replica in the erasure coded strip specified by the local erasure coded strip map 206 or 306.

At step 710, the strip generator worker 214 or node strip generator 314 determines whether the strip generator worker 214 or node strip generator 314 has detected a trigger condition associated with an erasure coded strip managed by the node. In some embodiments, the trigger condition may correspond to a pre-set time delay, a data capacity trigger for the replicas in an erasure coded strip, and/or the like. In a first example, the pre-set time delay may be on the order of 1 minute to 5 minutes after which the erasure coded strip is generated, whether or not all data blocks for all replicas have been received. In a second example, the trigger condition may correspond to a threshold minimum number of replicas included in the erasure coded strip (e.g., at least three replicas, at least 75% of the replicas, and/or the like). In a third example, the trigger condition may correspond to a threshold minimum amount of data (e.g., 4 megabytes) received for the erasure coded strip meet or exceed.

If, at step 710, the strip generator worker 214 or node strip generator 314 has not detected a trigger condition, then the method 700 proceeds to step 706, described above, to receive additional replicas of data blocks. Alternatively, the method proceeds to step 702, described above, where the node receives additional erasure coded strip data from one or more other nodes for newly generated erasure coded strips. If, on the other hand, the strip generator worker 214 or node strip generator 314 has detected a trigger condition, then the method 700 proceeds to step 712, where, in response to the trigger condition, the strip generator worker 214 or the node strip generator 314 generates an error correction block for the replicas of the data blocks included in the erasure coded strip.

At step 714, the strip generator worker 214 or the node strip generator 314 saves the error correction block in an extent store included in the node or in any other local memory in the node. At step 716, the strip generator worker 214 or the node strip generator 314 deletes the replicas of the data blocks. In the event of failure or unavailability in any one of nodes that stores the primary data blocks associated with the erasure coded strip, the no longer available data block or the error correction block may be recovered using the still available ones of the data blocks and the error correction block. The method 700 then proceeds to step 706 to receive additional replicas of data blocks. Alternatively, the method proceeds to step 702, described above, where the node receives additional erasure coded strip data from one or more other nodes for newly generated erasure coded strips.

Exemplary Virtualization System Architectures

According to some embodiments, all or portions of any of the foregoing techniques described with respect to FIGS. 1A-7 can be partitioned into one or more modules and instanced within, or as, or in conjunction with a virtualized controller in a virtual computing environment. Some example instances within various virtual computing environments are shown and discussed in further detail in FIGS. 8A-8D. Consistent with these embodiments, a virtualized controller includes a collection of software instructions that serve to abstract details of underlying hardware or software components from one or more higher-level processing entities. In some embodiments, a virtualized controller can be implemented as a virtual machine, as an executable container, or within a layer (e.g., such as a layer in a hypervisor). Consistent with these embodiments, distributed systems include collections of interconnected components that are designed for, or dedicated to, storage operations as well as being designed for, or dedicated to, computing and/or networking operations.

In some embodiments, interconnected components in a distributed system can operate cooperatively to achieve a particular objective such as to provide high-performance computing, high-performance networking capabilities, and/ or high-performance storage and/or high-capacity storage capabilities. For example, a first set of components of a distributed computing system can coordinate to efficiently use a set of computational or compute resources, while a second set of components of the same distributed computing system can coordinate to efficiently use the same or a different set of data storage facilities.

In some embodiments, a hyperconverged system coordinates the efficient use of compute and storage resources by and between the components of the distributed system. Adding a hyperconverged unit to a hyperconverged system expands the system in multiple dimensions. As an example, adding a hyperconverged unit to a hyperconverged system can expand the system in the dimension of storage capacity while concurrently expanding the system in the dimension of computing capacity and also in the dimension of networking bandwidth. Components of any of the foregoing distributed systems can comprise physically and/or logically distributed autonomous entities.

In some embodiments, physical and/or logical collections of such autonomous entities can sometimes be referred to as nodes. In some hyperconverged systems, compute and storage resources can be integrated into a unit of a node. Multiple nodes can be interrelated into an array of nodes, which nodes can be grouped into physical groupings (e.g., arrays) and/or into logical groupings or topologies of nodes (e.g., spoke-and-wheel topologies, rings, etc.). Some hyperconverged systems implement certain aspects of virtualization. For example, in a hypervisor-assisted virtualization environment, certain of the autonomous entities of a distributed system can be implemented as virtual machines. As another example, in some virtualization environments, autonomous entities of a distributed system can be implemented as executable containers. In some systems and/or environments, hypervisor-assisted virtualization techniques and operating system virtualization techniques are combined.

Figure 8A:
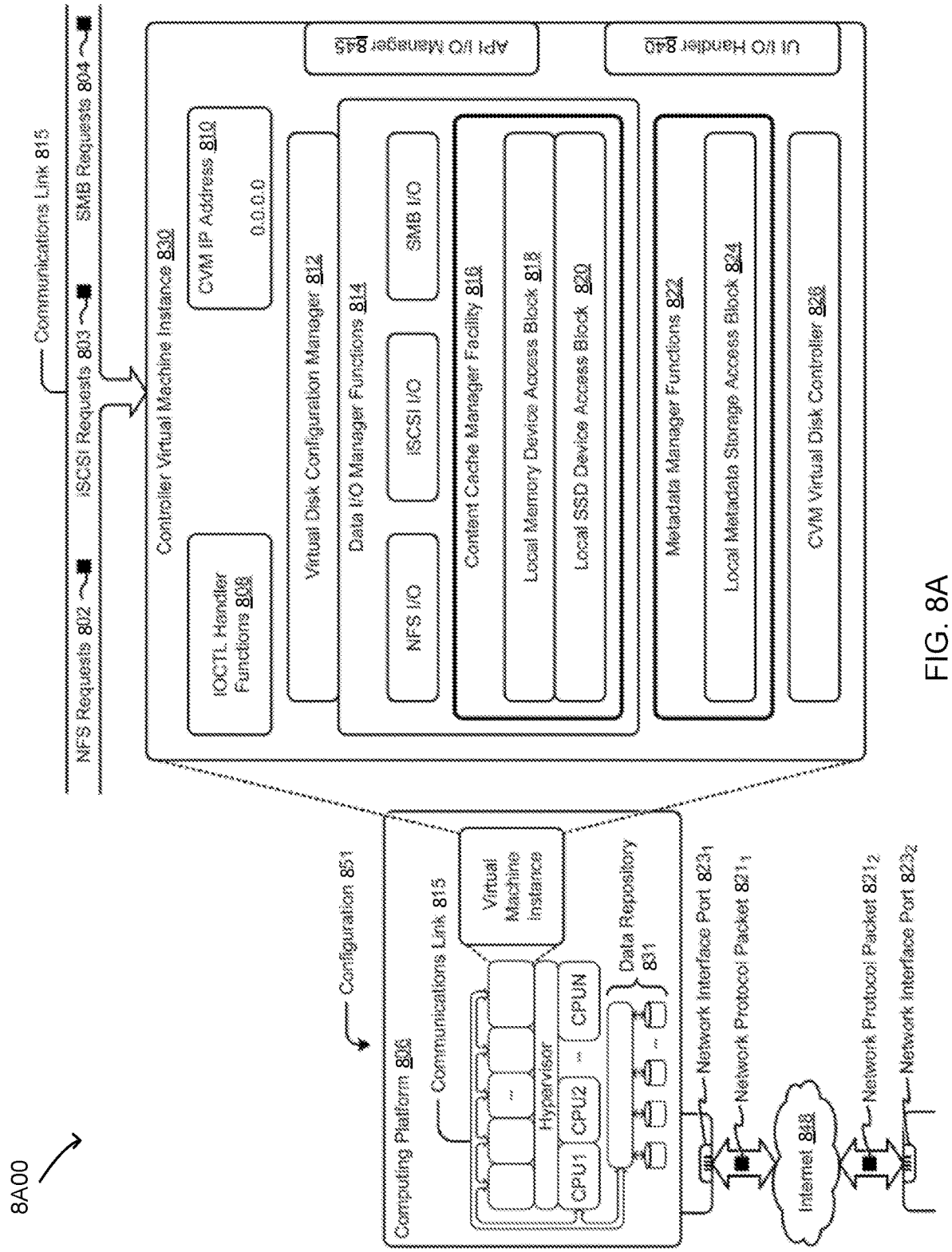
FIGS. 8A-8D are block diagrams illustrating virtualization system architectures configured to implement one or more aspects of the present embodiments.

FIG. 8A is a block diagram illustrating virtualization system architecture 8A00 configured to implement one or more aspects of the present embodiments. As shown in FIG. 8A, virtualization system architecture 8A00 includes a collection of interconnected components, including a controller virtual machine (CVM) instance 830 in a configuration 851. Configuration 851 includes a computing platform 806 that supports virtual machine instances that are deployed as user virtual machines, or controller virtual machines or both. Such virtual machines interface with a hypervisor (as shown). In some examples, virtual machines may include processing of storage I/O (input/output or IO) as received from any or every source within the computing platform. An example implementation of such a virtual machine that processes storage I/O is depicted as CVM instance 830.

In this and other configurations, a CVM instance receives block I/O storage requests as network file system (NFS) requests in the form of NFS requests 802, internet small computer storage interface (iSCSI) block IO requests in the form of iSCSI requests 803, Samba file system (SMB) requests in the form of SMB requests 804, and/or the like. The CVM instance publishes and responds to an internet protocol (IP) address (e.g., CVM IP address 810). Various forms of input and output can be handled by one or more IO control handler functions (e.g., IOCTL handler functions 808) that interface to other functions such as data IO manager functions 814 and/or metadata manager functions 822. As shown, the data IO manager functions can include communication with virtual disk configuration manager 812 and/or can include direct or indirect communication with any of various block IO functions (e.g., NFS IO, iSCSI IO, SMB IO, etc.).

In addition to block IO functions, configuration 851 supports IO of any form (e.g., block IO, streaming IO, packet-based IO, HTTP traffic, etc.) through either or both of a user interface (UI) handler such as UI IO handler 840 and/or through any of a range of application programming interfaces (APIs), possibly through API IO manager 845.

Communications link 815 can be configured to transmit (e.g., send, receive, signal, etc.) any type of communications packets comprising any organization of data items. The data items can comprise a payload data, a destination address (e.g., a destination IP address) and a source address (e.g., a source IP address), and can include various packet processing techniques (e.g., tunneling), encodings (e.g., encryption), formatting of bit fields into fixed-length blocks or into variable length fields used to populate the payload, and/or the like. In some cases, packet characteristics include a version identifier, a packet or payload length, a traffic class, a flow label, etc. In some cases, the payload comprises a data structure that is encoded and/or formatted to fit into byte or word boundaries of the packet.

In some embodiments, hard-wired circuitry may be used in place of, or in combination with, software instructions to implement aspects of the disclosure. Thus, embodiments of the disclosure are not limited to any specific combination of hardware circuitry and/or software. In embodiments, the term "logic" shall mean any combination of software or hardware that is used to implement all or part of the disclosure.

Computing platform 806 include one or more computer readable media that is capable of providing instructions to a data processor for execution. In some examples, each of the computer readable media may take many forms including, but not limited to, non-volatile media and volatile media. Non-volatile media includes any non-volatile storage medium, for example, solid state storage devices (SSDs) or optical or magnetic disks such as hard disk drives (HDDs) or hybrid disk drives, or random access persistent memories (RAPMs) or optical or magnetic media drives such as paper tape or magnetic tape drives. Volatile media includes dynamic memory such as random access memory (RANI). As shown, controller virtual machine instance 830 includes content cache manager facility 816 that accesses storage locations, possibly including local dynamic random access memory (DRAM) (e.g., through local memory device access block 818) and/or possibly including accesses to local solid state storage (e.g., through local SSD device access block 820).

Common forms of computer readable media include any non-transitory computer readable medium, for example, floppy disk, flexible disk, hard disk, magnetic tape, or any other magnetic medium; CD-ROM or any other optical medium; punch cards, paper tape, or any other physical medium with patterns of holes; or any RAM, PROM, EPROM, FLASH-EPROM, or any other memory chip or cartridge. Any data can be stored, for example, in any form of data repository 831, which in turn can be formatted into any one or more storage areas, and which can comprise parameterized storage accessible by a key (e.g., a filename, a table name, a block address, an offset address, etc.). Data repository 831 can store any forms of data, and may comprise a storage area dedicated to storage of metadata pertaining to the stored forms of data. In some cases, metadata can be divided into portions. Such portions and/or cache copies can be stored in the storage data repository and/or in a local storage area (e.g., in local DRAM areas and/or in local SSD areas). Such local storage can be accessed using functions provided by local metadata storage access block 824. The data repository 831 can be configured using CVM virtual disk controller 826, which can in turn manage any number or any configuration of virtual disks.

Execution of a sequence of instructions to practice certain of the disclosed embodiments is performed by one or more instances of a software instruction processor, or a processing element such as a data processor, or such as a central processing unit (e.g., CPU1, CPU2, . . . , CPUN). According to certain embodiments of the disclosure, two or more instances of configuration 851 can be coupled by communications link 815 (e.g., backplane, LAN, PSTN, wired or wireless network, etc.) and each instance may perform respective portions of sequences of instructions as may be required to practice embodiments of the disclosure.

The shown computing platform 806 is interconnected to the Internet 848 through one or more network interface ports (e.g., network interface port $823_1$ and network interface port $823_2$). Configuration 851 can be addressed through one or more network interface ports using an IP address. Any operational element within computing platform 806 can perform sending and receiving operations using any of a range of network protocols, possibly including network protocols that send and receive packets (e.g., network protocol packet $821_1$ and network protocol packet $821_2$).

Computing platform 806 may transmit and receive messages that can be composed of configuration data and/or any other forms of data and/or instructions organized into a data structure (e.g., communications packets). In some cases, the data structure includes program instructions (e.g., application code) communicated through the Internet 848 and/or through any one or more instances of communications link 815. Received program instructions may be processed and/or executed by a CPU as it is received and/or program instructions may be stored in any volatile or non-volatile storage for later execution. Program instructions can be transmitted via an upload (e.g., an upload from an access device over the Internet 848 to computing platform 806). Further, program instructions and/or the results of executing program instructions can be delivered to a particular user via a download (e.g., a download from computing platform 806 over the Internet 848 to an access device).

Configuration 851 is merely one example configuration. Other configurations or partitions can include further data processors, and/or multiple communications interfaces, and/or multiple storage devices, etc. within a partition. For example, a partition can bound a multi-core processor (e.g., possibly including embedded or collocated memory), or a partition can bound a computing cluster having a plurality of computing elements, any of which computing elements are connected directly or indirectly to a communications link. A first partition can be configured to communicate to a second partition. A particular first partition and a particular second partition can be congruent (e.g., in a processing element array) or can be different (e.g., comprising disjoint sets of components).

A cluster is often embodied as a collection of computing nodes that can communicate between each other through a local area network (e.g., LAN or virtual LAN (VLAN)) or a backplane. Some clusters are characterized by assignment of a particular set of the aforementioned computing nodes to access a shared storage facility that is also configured to communicate over the local area network or backplane. In many cases, the physical bounds of a cluster are defined by a mechanical structure such as a cabinet or such as a chassis or rack that hosts a finite number of mounted-in computing units. A computing unit in a rack can take on a role as a server, or as a storage unit, or as a networking unit, or any combination therefrom. In some cases, a unit in a rack is dedicated to provisioning of power to other units. In some cases, a unit in a rack is dedicated to environmental conditioning functions such as filtering and movement of air through the rack and/or temperature control for the rack. Racks can be combined to form larger clusters. For example, the LAN of a first rack having a quantity of 32 computing nodes can be interfaced with the LAN of a second rack having 16 nodes to form a two-rack cluster of 48 nodes. The former two LANs can be configured as subnets, or can be configured as one VLAN. Multiple clusters can communicate between one module to another over a WAN (e.g., when geographically distal) or a LAN (e.g., when geographically proximal).

In some embodiments, a module can be implemented using any mix of any portions of memory and any extent of hard-wired circuitry including hard-wired circuitry embodied as a data processor. Some embodiments of a module include one or more special-purpose hardware components (e.g., power control, logic, sensors, transducers, etc.). A data processor can be organized to execute a processing entity that is configured to execute as a single process or configured to execute using multiple concurrent processes to perform work. A processing entity can be hardware-based (e.g., involving one or more cores) or software-based, and/or can be formed using a combination of hardware and software that implements logic, and/or can carry out computations and/or processing steps using one or more processes and/or one or more tasks and/or one or more threads or any combination thereof.

Some embodiments of a module include instructions that are stored in a memory for execution so as to facilitate operational and/or performance characteristics pertaining to management of block stores. Various implementations of the data repository comprise storage media organized to hold a series of records and/or data structures.

Further details regarding general approaches to managing data repositories are described in U.S. Pat. No. 8,601,473 titled "ARCHITECTURE FOR MANAGING I/O AND STORAGE FOR A VIRTUALIZATION ENVIRONMENT", issued on Dec. 3, 2013, which is hereby incorporated by reference in its entirety.

Further details regarding general approaches to managing and maintaining data in data repositories are described in U.S. Pat. No. 8,549,518 titled "METHOD AND SYSTEM FOR IMPLEMENTING A MAINTENANCE SERVICE FOR MANAGING I/O AND STORAGE FOR A VIRTUALIZATION ENVIRONMENT", issued on Oct. 1, 2013, which is hereby incorporated by reference in its entirety.

Figure 8B:
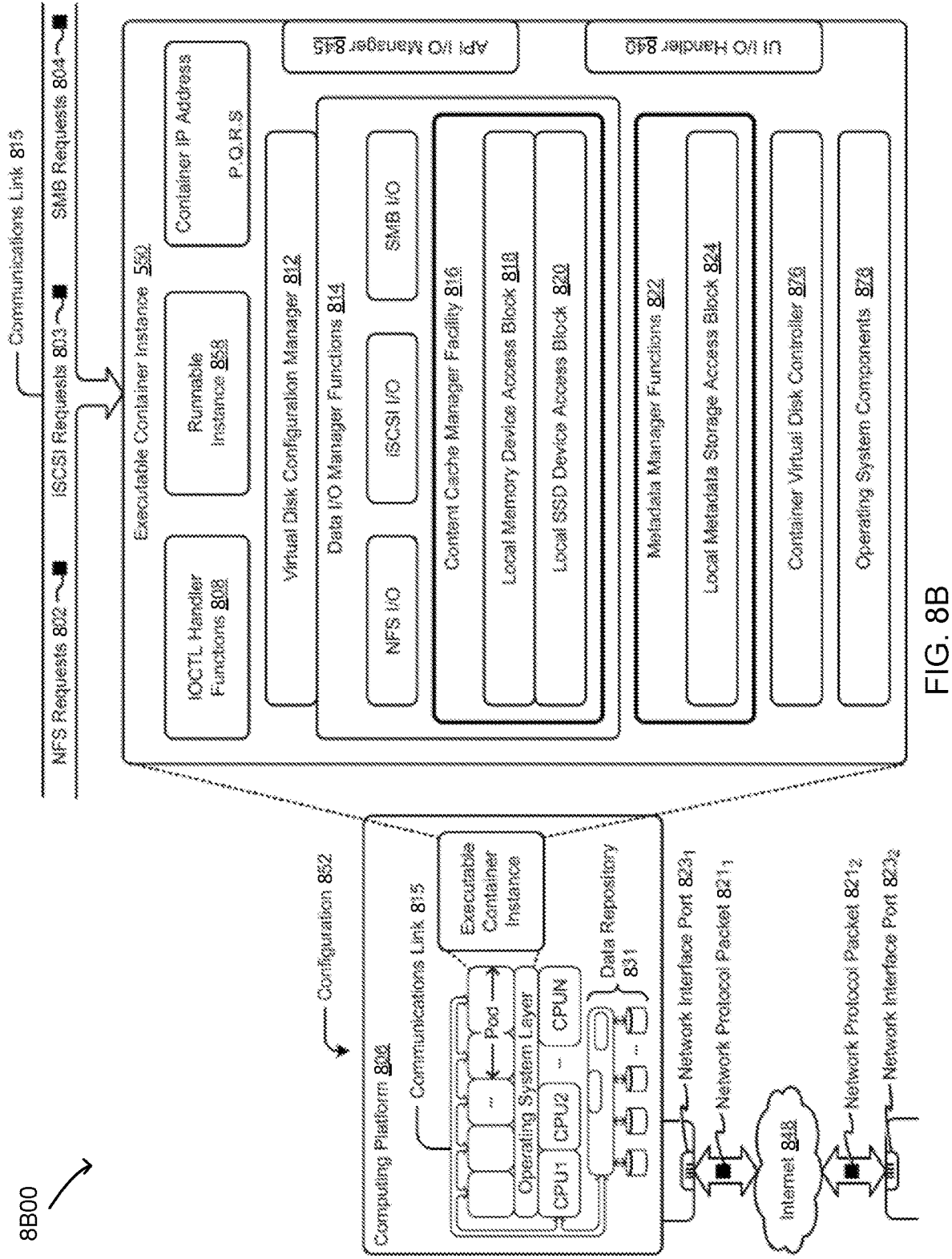

FIG. 8B depicts a block diagram illustrating another virtualization system architecture 8B00 configured to implement one or more aspects of the present embodiments. As shown in FIG. 8B, virtualization system architecture 8B00 includes a collection of interconnected components, including an executable container instance 850 in a configuration 852. Configuration 852 includes a computing platform 806 that supports an operating system layer (as shown) that performs addressing functions such as providing access to external requestors (e.g., user virtual machines or other processes) via an IP address (e.g., "P.Q.R.S", as shown). Providing access to external requestors can include implementing all or portions of a protocol specification (e.g., "http:") and possibly handling port-specific functions. In some embodiments, external requestors (e.g., user virtual machines or other processes) rely on the aforementioned addressing functions to access a virtualized controller for performing all data storage functions. Furthermore, when data input or output requests are received from a requestor running on a first node are received at the virtualized controller on that first node, then in the event that the requested data is located on a second node, the virtualized controller on the first node accesses the requested data by forwarding the request to the virtualized controller running at the second node. In some cases, a particular input or output request might be forwarded again (e.g., an additional or Nth time) to further nodes. As such, when responding to an input or output request, a first virtualized controller on the first node might communicate with a second virtualized controller on the second node, which second node has access to particular storage devices on the second node or, the virtualized controller on the first node may communicate directly with storage devices on the second node.

The operating system layer can perform port forwarding to any executable container (e.g., executable container instance 850). An executable container instance can be executed by a processor. Runnable portions of an executable container instance sometimes derive from an executable container image, which in turn might include all, or portions of any of, a Java archive repository (JAR) and/or its contents, and/or a script or scripts and/or a directory of scripts, and/or a virtual machine configuration, and may include any dependencies therefrom. In some cases, a configuration within an executable container might include an image comprising a minimum set of runnable code. Contents of larger libraries and/or code or data that would not be accessed during runtime of the executable container instance can be omitted from the larger library to form a smaller library composed of only the code or data that would be accessed during runtime of the executable container instance. In some cases, start-up time for an executable container instance can be much faster than start-up time for a virtual machine instance, at least inasmuch as the executable container image might be much smaller than a respective virtual machine instance. Furthermore, start-up time for an executable container instance can be much faster than start-up time for a virtual machine instance, at least inasmuch as the executable container image might have many fewer code and/or data initialization steps to perform than a respective virtual machine instance.

An executable container instance can serve as an instance of an application container or as a controller executable container. Any executable container of any sort can be rooted in a directory system and can be configured to be accessed by file system commands (e.g., "ls" or "ls-a", etc.). The executable container might optionally include operating system components 878, however such a separate set of operating system components need not be provided. As an alternative, an executable container can include runnable instance 858, which is built (e.g., through compilation and linking, or just-in-time compilation, etc.) to include all of the library and OS-like functions needed for execution of the runnable instance. In some cases, a runnable instance can be built with a virtual disk configuration manager, any of a variety of data IO management functions, etc. In some cases, a runnable instance includes code for, and access to, container virtual disk controller 876. Such a container virtual disk controller can perform any of the functions that the aforementioned CVM virtual disk controller 826 can perform, yet such a container virtual disk controller does not rely on a hypervisor or any particular operating system so as to perform its range of functions.

In some environments, multiple executable containers can be collocated and/or can share one or more contexts. For example, multiple executable containers that share access to a virtual disk can be assembled into a pod (e.g., a Kubernetes pod). Pods provide sharing mechanisms (e.g., when multiple executable containers are amalgamated into the scope of a pod) as well as isolation mechanisms (e.g., such that the namespace scope of one pod does not share the namespace scope of another pod).

Figure 8C:
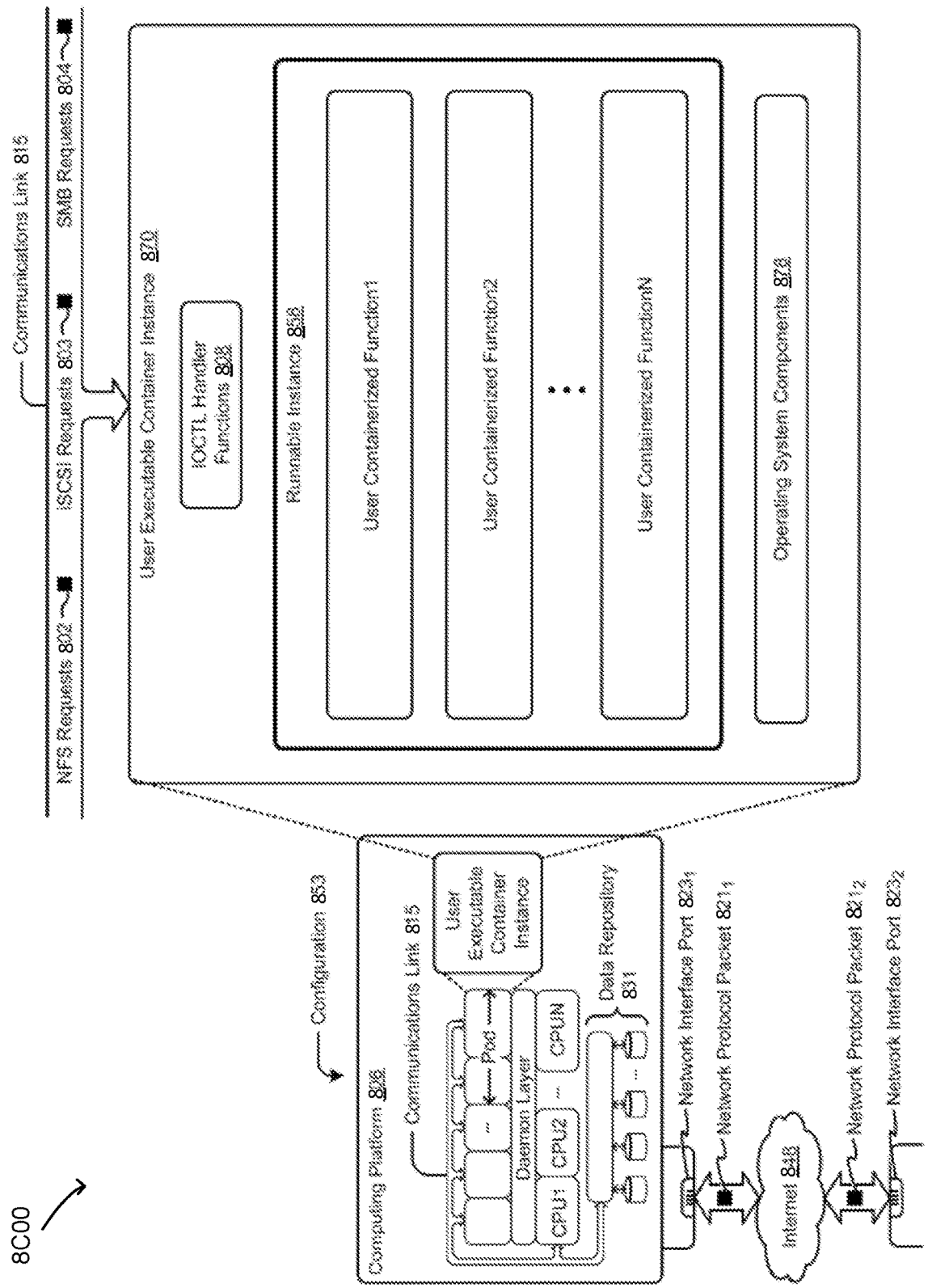

FIG. 8C is a block diagram illustrating virtualization system architecture 8C00 configured to implement one or more aspects of the present embodiments. As shown in FIG. 8C, virtualization system architecture 8C00 includes a collection of interconnected components, including a user executable container instance in configuration 853 that is further described as pertaining to user executable container instance 870. Configuration 853 includes a daemon layer (as shown) that performs certain functions of an operating system.

User executable container instance 870 comprises any number of user containerized functions (e.g., user containerized function1, user containerized function2, . . . , user containerized functionN). Such user containerized functions can execute autonomously or can be interfaced with or wrapped in a runnable object to create a runnable instance (e.g., runnable instance 858). In some cases, the shown operating system components 878 comprise portions of an operating system, which portions are interfaced with or included in the runnable instance and/or any user containerized functions. In some embodiments of a daemon-assisted containerized architecture, computing platform 806 might or might not host operating system components other than operating system components 878. More specifically, the shown daemon might or might not host operating system components other than operating system components 878 of user executable container instance 870.

In some embodiments, the virtualization system architecture 8A00, 8B00, and/or 8C00 can be used in any combination to implement a distributed platform that contains multiple servers and/or nodes that manage multiple tiers of storage where the tiers of storage might be formed using the shown data repository 831 and/or any forms of network accessible storage. As such, the multiple tiers of storage may include storage that is accessible over communications link 815. Such network accessible storage may include cloud storage or networked storage (e.g., a SAN or storage area network). Unlike prior approaches, the disclosed embodiments permit local storage that is within or directly attached to the server or node to be managed as part of a storage pool. Such local storage can include any combinations of the aforementioned SSDs and/or HDDs and/or RAPMs and/or hybrid disk drives. The address spaces of a plurality of storage devices, including both local storage (e.g., using node-internal storage devices) and any forms of network-accessible storage, are collected to form a storage pool having a contiguous address space.

Significant performance advantages can be gained by allowing the virtualization system to access and utilize local (e.g., node-internal) storage. This is because I/O performance is typically much faster when performing access to local storage as compared to performing access to networked storage or cloud storage. This faster performance for locally attached storage can be increased even further by using certain types of optimized local storage devices such as SSDs or RAPMs, or hybrid HDDs, or other types of high-performance storage devices.

In some embodiments, each storage controller exports one or more block devices or NFS or iSCSI targets that appear as disks to user virtual machines or user executable containers. These disks are virtual since they are implemented by the software running inside the storage controllers. Thus, to the user virtual machines or user executable containers, the storage controllers appear to be exporting a clustered storage appliance that contains some disks. User data (including operating system components) in the user virtual machines resides on these virtual disks.

In some embodiments, any one or more of the aforementioned virtual disks can be structured from any one or more of the storage devices in the storage pool. In some embodiments, a virtual disk is a storage abstraction that is exposed by a controller virtual machine or container to be used by another virtual machine or container. In some embodiments, the virtual disk is exposed by operation of a storage protocol such as iSCSI or NFS or SMB. In some embodiments, a virtual disk is mountable. In some embodiments, a virtual disk is mounted as a virtual storage device.

In some embodiments, some or all of the servers or nodes run virtualization software. Such virtualization software might include a hypervisor (e.g., as shown in configuration 851) to manage the interactions between the underlying hardware and user virtual machines or containers that run client software.

Distinct from user virtual machines or user executable containers, a special controller virtual machine (e.g., as depicted by controller virtual machine instance 830) or as a special controller executable container is used to manage certain storage and I/O activities. Such a special controller virtual machine is sometimes referred to as a controller executable container, a service virtual machine (SVM), a service executable container, or a storage controller. In some embodiments, multiple storage controllers are hosted by multiple nodes. Such storage controllers coordinate within a computing system to form a computing cluster.

The storage controllers are not formed as part of specific implementations of hypervisors. Instead, the storage controllers run above hypervisors on the various nodes and work together to form a distributed system that manages all of the storage resources, including the locally attached storage, the networked storage, and the cloud storage. In example embodiments, the storage controllers run as special virtual machines—above the hypervisors—thus, the approach of using such special virtual machines can be used and implemented within any virtual machine architecture. Furthermore, the storage controllers can be used in conjunction with any hypervisor from any virtualization vendor and/or implemented using any combinations or variations of the aforementioned executable containers in conjunction with any host operating system components.

Figure 8D:
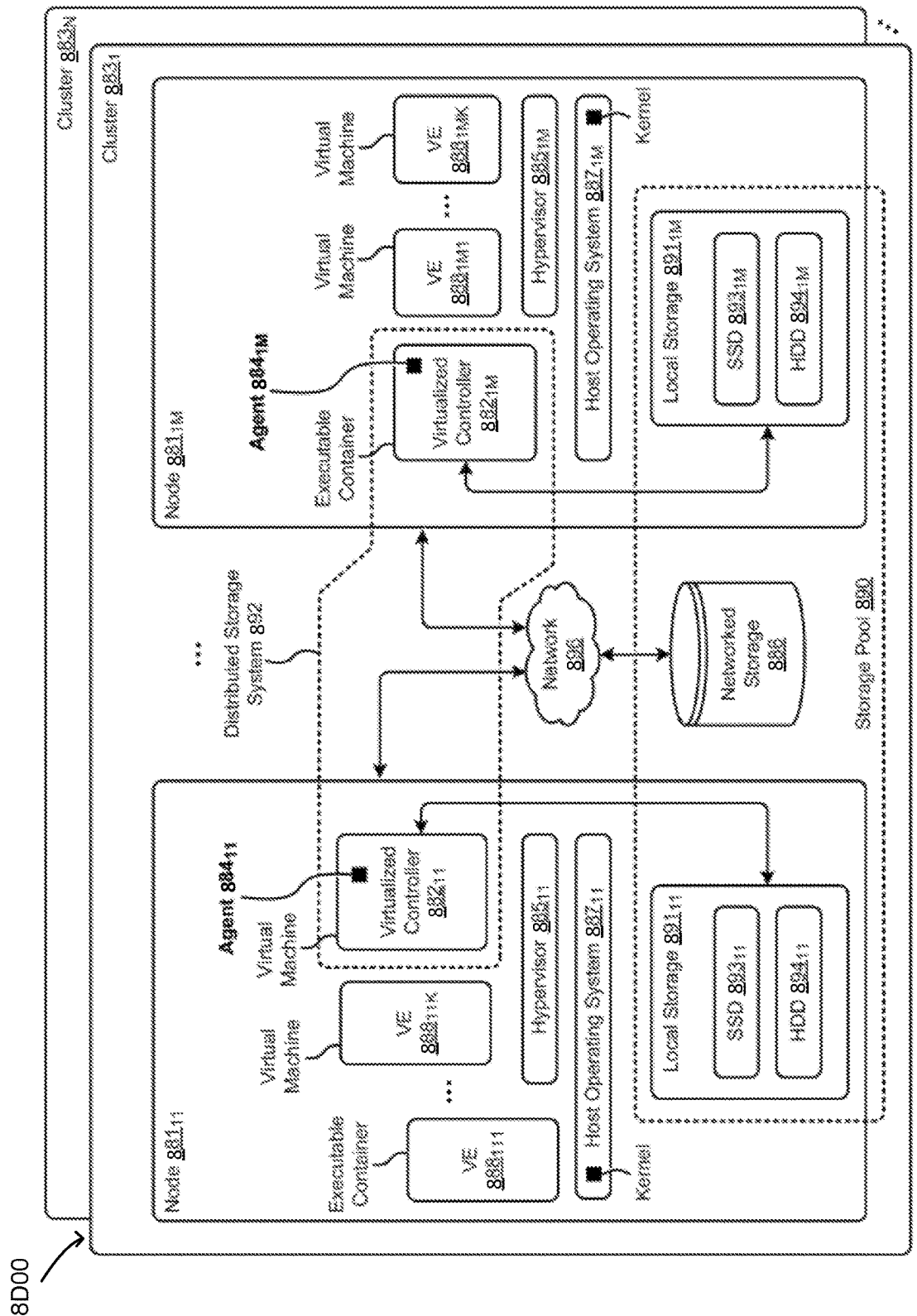

FIG. 8D is a block diagram illustrating virtualization system architecture 8D00 configured to implement one or more aspects of the present embodiments. As shown in FIG. 8D, virtualization system architecture 8D00 includes a distributed virtualization system that includes multiple clusters (e.g., cluster $883_1$, . . . , cluster $883_N$) comprising multiple nodes that have multiple tiers of storage in a storage pool. Representative nodes (e.g., node $881_{11}$, . . . , node $881_{1M}$) and storage pool 890 associated with cluster $883_1$ are shown. Each node can be associated with one server, multiple servers, or portions of a server. The nodes can be associated (e.g., logically and/or physically) with the clusters. As shown, the multiple tiers of storage include storage that is accessible through a network 896, such as a networked storage 886 (e.g., a storage area network or SAN, network attached storage or NAS, etc.). The multiple tiers of storage further include instances of local storage (e.g., local storage $891_{11}$, . . . , local storage $891_{1M}$). For example, the local storage can be within or directly attached to a server and/or appliance associated with the nodes. Such local storage can include solid state drives (SSD $893_{11}$, . . . , SSD $893_{1M}$), hard disk drives (HDD $894_{11}$, . . . , HDD $894_{1M}$), and/or other storage devices.

As shown, any of the nodes of the distributed virtualization system can implement one or more user virtualized entities (e.g., VE $888_{111}$, . . . , VE $888_{11K}$, . . . , VE $888_{1M1}$, . . . , VE $888_{1MK}$), such as virtual machines (VMs) and/or executable containers. The VMs can be characterized as software-based computing "machines" implemented in a container-based or hypervisor-assisted virtualization environment that emulates the underlying hardware resources (e.g., CPU, memory, etc.) of the nodes. For example, multiple VMs can operate on one physical machine (e.g., node host computer) running a single host operating system (e.g., host operating system $887_{11}$, . . . , host operating system $887_{1M}$), while the VMs run multiple applications on various respective guest operating systems. Such flexibility can be facilitated at least in part by a hypervisor (e.g., hypervisor $885_{11}$, . . . , hypervisor $885_{1M}$), which hypervisor is logically located between the various guest operating systems of the VMs and the host operating system of the physical infrastructure (e.g., node).

As an alternative, executable containers may be implemented at the nodes in an operating system-based virtualization environment or in a containerized virtualization environment. The executable containers are implemented at the nodes in an operating system virtualization environment or container virtualization environment. The executable containers can include groups of processes and/or resources (e.g., memory, CPU, disk, etc.) that are isolated from the node host computer and other containers. Such executable containers directly interface with the kernel of the host operating system (e.g., host operating system $887_{11}$, . . . , host operating system $887_{1M}$) without, in most cases, a hypervisor layer. This lightweight implementation can facilitate efficient distribution of certain software components, such as applications or services (e.g., micro-services). Any node of a distributed virtualization system can implement both a hypervisor-assisted virtualization environment and a container virtualization environment for various purposes. Also, any node of a distributed virtualization system can implement any one or more types of the foregoing virtualized controllers so as to facilitate access to storage pool 890 by the VMs and/or the executable containers.

Multiple instances of such virtualized controllers can coordinate within a cluster to form the distributed storage system 892 which can, among other operations, manage the storage pool 890. This architecture further facilitates efficient scaling in multiple dimensions (e.g., in a dimension of computing power, in a dimension of storage space, in a dimension of network bandwidth, etc.).

In some embodiments, a particularly-configured instance of a virtual machine at a given node can be used as a virtualized controller in a hypervisor-assisted virtualization environment to manage storage and I/O (input/output or IO) activities of any number or form of virtualized entities. For example, the virtualized entities at node $881_{11}$ can interface with a controller virtual machine (e.g., virtualized controller $882_{11}$) through hypervisor $885_{11}$ to access data of storage pool 890. In such cases, the controller virtual machine is not formed as part of specific implementations of a given hypervisor. Instead, the controller virtual machine can run as a virtual machine above the hypervisor at the various node host computers. When the controller virtual machines run above the hypervisors, varying virtual machine architectures and/or hypervisors can operate with the distributed storage system 892. For example, a hypervisor at one node in the distributed storage system 892 might correspond to software from a first vendor, and a hypervisor at another node in the distributed storage system 892 might correspond to a second software vendor. As another virtualized controller implementation example, executable containers can be used to implement a virtualized controller (e.g., virtualized controller $882_{1M}$) in an operating system virtualization environment at a given node. In this case, for example, the virtualized entities at node $881_{1M}$ can access the storage pool 890 by interfacing with a controller container (e.g., virtualized controller $882_{1M}$) through hypervisor $885_{1M}$ and/or the kernel of host operating system $887_{1M}$.

In some embodiments, one or more instances of an agent can be implemented in the distributed storage system 892 to facilitate the herein disclosed techniques. Specifically, agent $884_{11}$ can be implemented in the virtualized controller $882_{11}$, and agent $884_{1M}$ can be implemented in the virtualized controller $882_{1M}$. Such instances of the virtualized controller can be implemented in any node in any cluster. Actions taken by one or more instances of the virtualized controller can apply to a node (or between nodes), and/or to a cluster (or between clusters), and/or between any resources or subsystems accessible by the virtualized controller or their agents.

Exemplary Computer System

Figure 9:
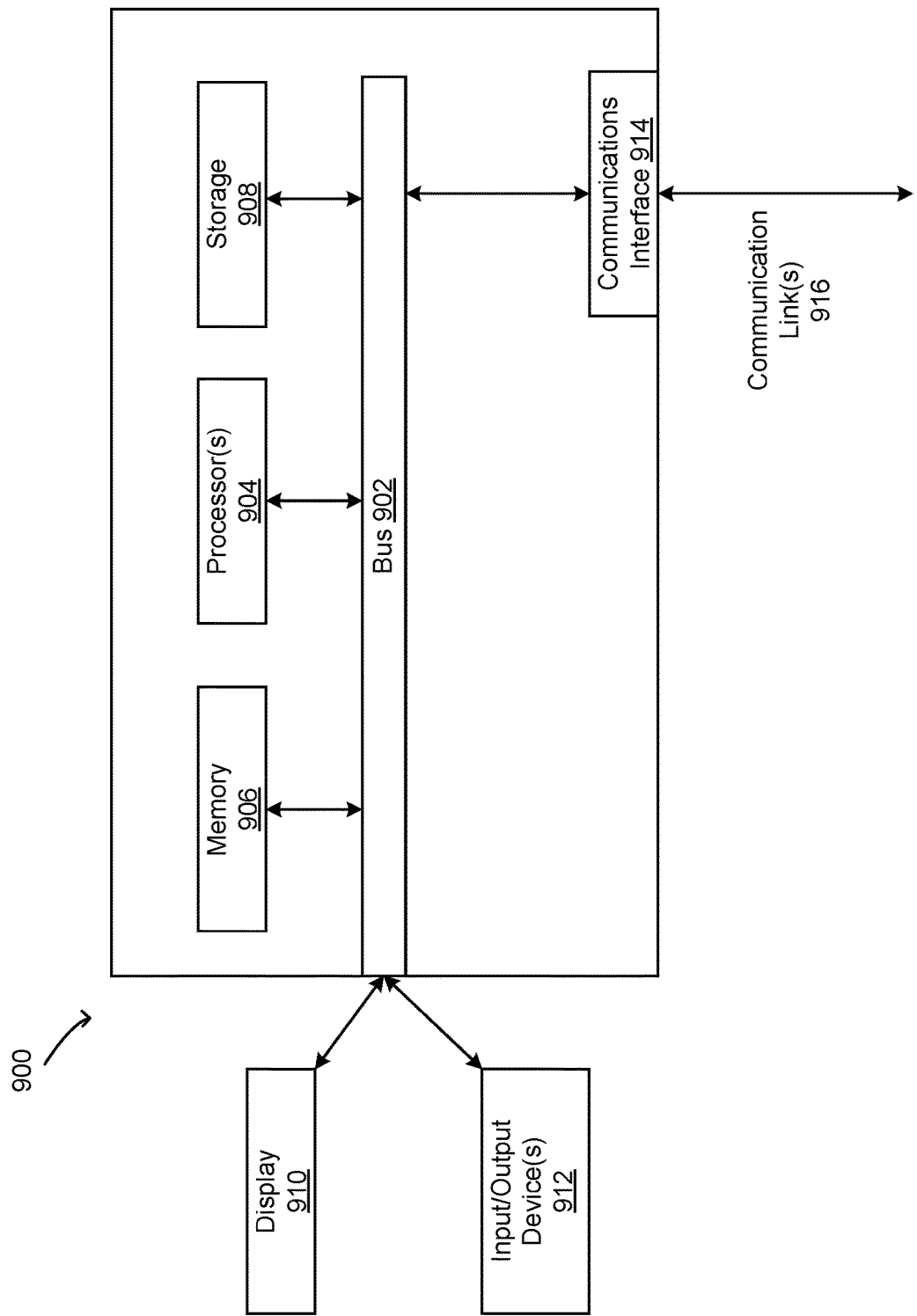
FIG. 9 is a block diagram illustrating a computer system configured to implement one or more aspects of the present embodiments.

FIG. 9 is a block diagram illustrating a computer system 900 configured to implement one or more aspects of the present embodiments. In some embodiments, computer system 900 may be representative of a computer system for implementing one or more aspects of the embodiments disclosed in FIGS. 1-8B. In some embodiments, computer system 900 is a server machine operating in a data center or a cloud computing environment, suitable for implementing an embodiment of the present disclosure. As shown, computer system 900 includes a bus 902 or other communication mechanism for communicating information, which interconnects subsystems and devices, such as one or more processors 904, memory 906, storage 908, optional display 910, one or more input/output devices 912, and a communications interface 914. Computer system 900 described herein is illustrative and any other technically feasible configurations fall within the scope of the present disclosure.

The one or more processors 904 include any suitable processors implemented as a central processing unit (CPU), a graphics processing unit (GPU), an application-specific integrated circuit (ASIC), a field programmable gate array (FPGA), an artificial intelligence (AI) accelerator, any other type of processor, or a combination of different processors, such as a CPU configured to operate in conjunction with a GPU. In general, the one or more processors 904 may be any technically feasible hardware unit capable of processing data and/or executing software applications. Further, in the context of this disclosure, the computing elements shown in computer system 900 may correspond to a physical computing system (e.g., a system in a data center) or may be a virtual computing instance, such as any of the virtual machines described in FIGS. 9A-9D.

Memory 906 includes a random access memory (RAM) module, a flash memory unit, and/or any other type of memory unit or combination thereof. The one or more processors 904, and/or communications interface 914 are configured to read data from and write data to memory 906. Memory 906 includes various software programs that include one or more instructions that can be executed by the one or more processors 904 and application data associated with said software programs.

Storage 908 includes non-volatile storage for applications and data, and may include one or more fixed or removable disk drives, HDDs, SSD, NVMes, vDisks, flash memory devices, and/or other magnetic, optical, and/or solid state storage devices.

Communications interface 914 includes hardware and/or software for coupling computer system 900 to one or more communication links 915. The one or more communication links 915 may include any technically feasible type of communications network that allows data to be exchanged between computer system 900 and external entities or devices, such as a web server or another networked computing system. For example, the one or more communication links 915 may include one or more wide area networks (WANs), one or more local area networks (LANs), one or more wireless (WiFi) networks, the Internet, and/or the like.

In sum, embodiments of the present disclosure include techniques for generating erasure coded blocks for nodes in a cluster from a central strip generator leader. The central strip generator leader manages erasure coding for multiple nodes in the cluster. The strip generator leader pre-generates erasure coded strips based on the configuration for the cluster. The strip generator leader preserves data locality at the file level by designating that the data blocks for a particular file are stored on a single node. This approach minimizes network traffic during when accessing different portions of large files. The strip generator leader generates a strip map that identifies the data blocks in each erasure coded strip. Rather than allowing the strip generator workers to send the replicas of the data blocks to just any of the nodes in the cluster, the strip generator leader pre-generates erasure coded strips that pre-designate where a strip generator worker is to send the replicas. Under this approach the erasure coded strips are set-up in advance by the strip generator worker on the pre-designated node where the replicas are being collected. In some embodiments, the strip generator leader may periodically generate new erasure coded strips on the various pre-designated nodes and/or may generate the erasure coded strips upon the request of a strip generator worker that has received a write request for a data block and the strip generator worker has not yet been assigned a pre-designated node to send the replica of the data block to. The strip generator leader then commands the first strip generator worker that when the first strip generator worker receives a write request, the first strip generator worker is to send the replica to the pre-designated node. In response to certain trigger conditions, the strip generator worker on the pre-designated node generates an error correction block for the replicas of the data blocks included in the erasure coded strip. The strip generator worker saves the error correction block for the erasure coded strip in an extent store included in the node or in any other local memory in the node. The strip generator worker deletes the replicas of the data blocks. In the event of failure or unavailability in any one of nodes that stores the primary data blocks associated with the erasure coded strip, the no longer available data block or the error correction block may be recovered using the still available ones of the data blocks and the error correction block.

Further, embodiments of the present disclosure techniques for generating erasure coded blocks where a node strip generator in each node decides which node is the pre-designated node for storing replicas and managing erasure coded strips. Such techniques may be advantageous in applications where data locality does not need to be preserved. In these embodiments, a cluster includes nodes, where each of the nodes includes its own node strip generator that responds to write requests directed to the respective node and manages data on an extent store or other data repository.

The node strip generator on a first node pre-designates other nodes to receive replicas from the first node. The pre-designated nodes generate erasure coded strips for the replicas received from the first node. The node strip generator on the first node, upon receiving a write request for a data block writes the primary copy of the data block in an extent store on the first node. Alternatively, the node strip generator on the first node, upon receiving a write request for a data block transmits the primary copy of the data block to a second node in the cluster for storage in an extent store on the second node. The node strip generator on the first node further transmits a replica of the data block to the pre-designated node. The node strip generator on the pre-designated node places the replica of the data block in the erasure coded strip, stored in the extent store, that the pre-designated node is maintaining on behalf of the first node. In response to certain trigger conditions, the node strip generator on the pre-designated node generates an error correction block for the replicas of the data blocks included in the erasure coded strip. The node strip generator saves the error correction block for the erasure coded strip in an extent store included in the node or in any other local memory in the node. The node strip generator deletes the replicas of the data blocks. In the event of failure or unavailability in any one of nodes that stores the primary data blocks associated with the erasure coded strip, the no longer available data block or the error correction block may be recovered using the still available ones of the data blocks and the error correction block.

At least one technical advantage of the disclosed techniques relative to the prior art is that the disclosed techniques can, for write-once-read-many data blocks, remove replicas from the nodes of a cluster and replace the replicas with an error correction block more quickly than previous approaches. This reduces the amount of storage used by the cluster to support replication. Additionally, the disclosed techniques reduce network traffic during erasure coding because erasure coding of an erasure coded strip is performed on a single node of the cluster. The disclosed techniques also avoid the need for a background scanning process to monitor the write-once-read-many data blocks for their write cold status. These technical advantages provide one or more technological advancements over prior art approaches.

1. In various embodiments, one or more non-transitory computer-readable media store program instructions that, when executed by one or more processors, cause the one or more processors to perform steps of: receiving, by a pre-designated node, data associated with an erasure coded strip from a first node; receiving a replica of a first data block from the first node; saving the replica in the erasure coded strip; and in response to a trigger condition, replacing, by the pre-designated node, the replica and at least one replica of a second data block with an error correction block.

2. The one or more non-transitory computer-readable media according to clause 1, wherein the trigger condition is a pre-determined time delay.

3. The one or more non-transitory computer-readable media according to clause 1 or clause 2, wherein the trigger condition is the erasure coded strip reaching a capacity threshold.

4. The one or more non-transitory computer-readable media according to any of clauses 1-3, wherein the trigger condition is the erasure coded strip having a threshold minimum number of replicas.

5. The one or more non-transitory computer-readable media according to any of clauses 1-4, wherein the erasure coded strip is stored in a faster storage tier than the error correction block.

6. The one or more non-transitory computer-readable media according to any of clauses 1-5, wherein the error correction block is a parity block.

7. The one or more non-transitory computer-readable media according to any of clauses 1-6, wherein the at least one replica of the second data block is received from the first node.

8. In various embodiments, a method for erasure coding of replicated data blocks comprises: receiving, by a pre-designated node, data associated with an erasure coded strip from a first node; receiving a replica of a first data block from the first node; saving the replica in the erasure coded strip; and in response to a trigger condition, replacing, by the pre-designated node, the replica and at least one replica of a second data block with an error correction block.

9. The method according to clause 8, wherein the trigger condition is: a pre-determined time delay; the erasure coded strip reaching a capacity threshold; or the erasure coded strip having a threshold minimum number of replicas.

10. The method according to clause 8 or clause 9, wherein the erasure coded strip is stored in a faster storage tier than the error correction block.

11. The method according to any of clauses 8-10, wherein the error correction block is a parity block.

12. The method according to any of clauses 8-11, wherein the at least one replica of the second data block is received from the first node.

13. In various embodiments, a system comprises: a memory storing instructions; and one or more processors that is coupled to the memory and, when executing the instructions: receive, by a pre-designated node, data associated with an erasure coded strip from a first node; receive a replica of a first data block from the first node; save the replica in the erasure coded strip; and in response to a trigger condition, replace, by the pre-designated node, the replica and at least one replica of a second data block with an error correction block.

14. The system according to clause 13, wherein the trigger condition is: a pre-determined time delay; the erasure coded strip reaching a capacity threshold; or the erasure coded strip having a threshold minimum number of replicas.

15. The system of according to clause 13 or clause 14, wherein the erasure coded strip is stored in a faster storage tier than the error correction block.

16. The system according to any of clauses 13-15, wherein the error correction block is a parity block.

17. The system according to any of clauses 13-16, wherein the at least one replica of the second data block is received from the first node.

18. In various embodiments, one or more non-transitory computer-readable media store program instructions that, when executed by one or more processors, cause the one or more processors to perform steps of: receiving, at a first node, a write request for a first data block; designating a pre-designated node to generate an erasure coded strip that includes the first data block; transmitting data associated with the erasure coded strip to the pre-designated node; and sending a replica of the first data block to the pre-designated node for storage in the erasure coded strip on the pre-designated node.

19. The one or more non-transitory computer-readable media according to clause 18, wherein the steps further comprise saving the primary copy of the first data block in the first node.

20. The one or more non-transitory computer-readable media according to clause 18 or clause 19, wherein the steps further comprise: designating a second node to store a primary copy of the first data block, wherein the second node is different from the first node and the pre-designated node; and sending the primary copy of the first data block to the second node, the second node saving the primary copy of the first data block.

21. The one or more non-transitory computer-readable media according to any of clauses 18-20, wherein the steps further comprise: receiving, at the first node, a second write request for a second data block; and sending a replica of the second data block to the pre-designated node for storage in the erasure coded strip on the pre-designated node.

22. The one or more non-transitory computer-readable media according to any of clauses 18-21, wherein, in response to a trigger condition, the pre-designated node replaces the replica and at least one replica of a second data block with an error correction block.

23. The one or more non-transitory computer-readable media according to any of clauses 18-22, wherein the trigger condition is a pre-determined time delay.

24. The one or more non-transitory computer-readable media according to any of clauses 18-23, wherein the trigger condition is the erasure coded strip reaching a capacity threshold.

25. The one or more non-transitory computer-readable media according to any of clauses 18-24, wherein the trigger condition is the erasure coded strip having a threshold minimum number of replicas.

26. In various embodiments, a method for erasure coding of replicated data blocks comprises: receiving, at a first node, a write request for a first data block; designating a pre-designated node to generate an erasure coded strip that includes the first data block; transmitting data associated with the erasure coded strip to the pre-designated node; and sending a replica of the first data block to the pre-designated node for storage in the erasure coded strip on the pre-designated node.

27. The method according to clause 26, further comprising saving the primary copy of the first data block in the first node.

28. The method according to clause 26 or clause 27, further comprising: designating a second node to store a primary copy of the first data block, wherein the second node is different from the first node and the pre-designated node; and sending the primary copy of the first data block to the second node, the second node saving the primary copy of the first data block.

29. The method according to any of clauses 26-28, further comprising: receiving, at the first node, a second write request for a second data block; and sending a replica of the second data block to the pre-designated node for storage in the erasure coded strip on the pre-designated node.

30. The method according to any of clauses 26-29, wherein, in response to a trigger condition, the pre-designated node replaces the replica and at least one replica of a second data block with an error correction block.

31. The method according to any of clauses 26-30, wherein the trigger condition is: a pre-determined time delay; the erasure coded strip reaching a capacity threshold; or the erasure coded strip having a threshold minimum number of replicas.

32. In various embodiments, a system comprises: a memory storing instructions; and one or more processors that is coupled to the memory and, when executing the instructions: receive, at a first node, a write request for a first data block; designate a pre-designated node to generate an erasure coded strip that includes the first data block; transmit data associated with the erasure coded strip to the pre-designated node; and send a replica of the first data block to the pre-designated node for storage in the erasure coded strip on the pre-designated node.

33. The system according to clause 32, wherein the one or more processors, when executing the instructions, further save the primary copy of the first data block in the first node.

34. The system according to clause 32 or clause 33, wherein the one or more processors, when executing the instructions, further: designate a second node to store a primary copy of the first data block, wherein the second node is different from the first node and the pre-designated node; and send the primary copy of the first data block to the second node, the second node saving the primary copy of the first data block.

35. The system according to any of clauses 32-34, wherein the one or more processors, when executing the instructions, further: receive, at the first node, a second write request for a second data block; and send a replica of the second data block to the pre-designated node for storage in the erasure coded strip on the pre-designated node.

36. The system according to any of clauses 32-35, wherein, in response to a trigger condition, the pre-designated node replaces the replica and at least one replica of a second data block with an error correction block.

37. The system according to any of clauses 32-36, wherein the trigger condition is: a pre-determined time delay; the erasure coded strip reaching a capacity threshold; or the erasure coded strip having a threshold minimum number of replicas.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RANI), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. One or more non-transitory computer-readable media storing program instructions that, when executed by one or more processors, cause the one or more processors to perform steps of:
   receiving, by a pre-designated node from a first node, data associated with an erasure coded strip;
   receiving a replica of a first data block from the first node;
   saving the replica in the erasure coded strip; and
   in response to a trigger condition, replacing, by the pre-designated node, the replica and at least one replica of a second data block with an error correction block.

2. The one or more non-transitory computer-readable media of claim 1, wherein the trigger condition is a pre-determined time delay.

3. The one or more non-transitory computer-readable media of claim 1, wherein the trigger condition is the erasure coded strip reaching a capacity threshold.

4. The one or more non-transitory computer-readable media of claim 1, wherein the trigger condition is the erasure coded strip having a threshold minimum number of replicas.

5. The one or more non-transitory computer-readable media of claim 1, wherein the erasure coded strip is stored in a faster storage tier than the error correction block.

6. The one or more non-transitory computer-readable media of claim 1, wherein the error correction block is a parity block.

7. The one or more non-transitory computer-readable media of claim 1, wherein the at least one replica of the second data block is received from the first node.

8. A method for erasure coding of replicated data blocks, the method comprising:
receiving, by a pre-designated node from a first node, data associated with an erasure coded strip;
receiving a replica of a first data block from the first node;
saving the replica in the erasure coded strip; and
in response to a trigger condition, replacing, by the pre-designated node, the replica and at least one replica of a second data block with an error correction block.

9. The method of claim 8, wherein the trigger condition is:
a pre-determined time delay;
the erasure coded strip reaching a capacity threshold; or
the erasure coded strip having a threshold minimum number of replicas.

10. The method of claim 8, wherein the erasure coded strip is stored in a faster storage tier than the error correction block.

11. The method of claim 8, wherein the error correction block is a parity block.

12. The method of claim 8, wherein the at least one replica of the second data block is received from the first node.

13. A system, comprising:
a pre-designated node comprising:
a first memory storing first instructions; and
one or more first processors that are coupled to the first memory and, when executing the first instructions:
receive, from a first node, data associated with an erasure coded strip;
receive a replica of a first data block from the first node;
save the replica in the erasure coded strip; and
in response to a trigger condition, replace, by the pre-designated node, the replica and a replica of a second data block with an error correction block.

14. The system of claim 13, wherein the trigger condition is:
a pre-determined time delay;
the erasure coded strip reaching a capacity threshold; or
the erasure coded strip having a threshold minimum number of replicas.

15. The system of claim 13, wherein the erasure coded strip is stored in a faster storage tier than the error correction block.

16. The system of claim 13, wherein the error correction block is a parity block.

17. The system of claim 13, wherein the replica of the second data block is received from the first node.

18. The system of claim 13, further comprising:
the first node, the first node comprising:
a second memory storing second instructions; and
one or more second processors that are coupled to the second memory and, when executing the second instructions:
receive a write request for the first data block;
transmit the data to the pre-designated node; and
send the replica of the first data block to the pre-designated node.

19. The system of claim 18, wherein the one or more second processors when executing the second instructions further save a primary copy of the first data block in the first node.

20. The system of claim 18, wherein the one or more second processors when executing the second instructions further
send a primary copy of the first data block to a second node, wherein the second node is configured to save the primary copy of the first data block, wherein the second node is different from the first node and the pre-designated node.

21. The system of claim 18, wherein the one or more second processors when executing the second instructions further:
receive a second write request for the second data block; and
send the replica of the second data block to the pre-designated node for storage in the erasure coded strip.

* * * * *